United States Patent
Peng et al.

(10) Patent No.: US 11,665,971 B2
(45) Date of Patent: *May 30, 2023

(54) METAL ETCHING STOP LAYER IN MAGNETIC TUNNEL JUNCTION MEMORY CELLS

(71) Applicant: Taiwan Semiconductor Manufacturing Co., Ltd., Hsinchu (TW)

(72) Inventors: Tai-Yen Peng, Hsinchu (TW); Sin-Yi Yang, Taichung (TW); Chen-Jung Wang, Hsinchu (TW); Yu-Shu Chen, Hsinchu (TW); Chien Chung Huang, Taichung (TW); Han-Ting Lin, Hsinchu (TW); Jyu-Horng Shieh, Hsinchu (TW); Chih-Yuan Ting, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/408,648

(22) Filed: Aug. 23, 2021

(65) Prior Publication Data

US 2021/0384418 A1    Dec. 9, 2021

Related U.S. Application Data

(63) Continuation of application No. 16/371,784, filed on Apr. 1, 2019, now Pat. No. 11,101,429.

(Continued)

(51) Int. Cl.
| | | |
|---|---|---|
| *H01L 21/00* | (2006.01) | |
| *H01L 43/12* | (2006.01) | |

(Continued)

(52) U.S. Cl.
CPC ........... *H01L 43/12* (2013.01); *H01L 27/222* (2013.01); *H01L 43/02* (2013.01)

(58) Field of Classification Search
CPC ........ H01L 43/02; H01L 27/222; H01L 43/12
See application file for complete search history.

(56) References Cited

U.S. PATENT DOCUMENTS

| 6,984,529 B2 | 1/2006 | Stojakovic et al. |
| 7,183,130 B2 | 2/2007 | Nuetzel et al. |

(Continued)

FOREIGN PATENT DOCUMENTS

| DE | 102004034822 A1 | 3/2005 |
| JP | 2018519659 A | 7/2018 |

(Continued)

*Primary Examiner* — Nicholas J Tobergte
(74) *Attorney, Agent, or Firm* — Slater Matsil, LLP

(57) ABSTRACT

A method of forming integrated circuits includes forming Magnetic Tunnel Junction (MTJ) stack layers, depositing a conductive etch stop layer over the MTJ stack layers, depositing a conductive hard mask over the conductive etch stop layer, and patterning the conductive hard mask to form etching masks. The patterning is stopped by the conductive etch stop layer. The method further includes etching the conducive etch stop layer using the etching masks to define patterns, and etching the MTJ stack layers to form MTJ stacks.

20 Claims, 20 Drawing Sheets

Related U.S. Application Data

(60) Provisional application No. 62/738,529, filed on Sep. 28, 2018.

(51) Int. Cl.
    *H01L 27/22*     (2006.01)
    *H01L 43/02*     (2006.01)

(56) References Cited

U.S. PATENT DOCUMENTS

| | | |
|---|---|---|
| 9,269,893 B2 | 2/2016 | Lu et al. |
| 9,653,679 B1 | 5/2017 | Annunziata et al. |
| 11,101,429 B2 * | 8/2021 | Peng .................... H01L 27/222 |
| 2005/0090111 A1 | 4/2005 | Lee |
| 2005/0254180 A1 | 11/2005 | Kanakasabapathy et al. |
| 2008/0006810 A1 | 1/2008 | Park et al. |
| 2015/0255718 A1 | 9/2015 | Liu et al. |
| 2016/0351799 A1 | 12/2016 | Xue et al. |

FOREIGN PATENT DOCUMENTS

| | | |
|---|---|---|
| KR | 20160118386 A | 10/2016 |
| WO | 2017048520 A1 | 3/2017 |

* cited by examiner

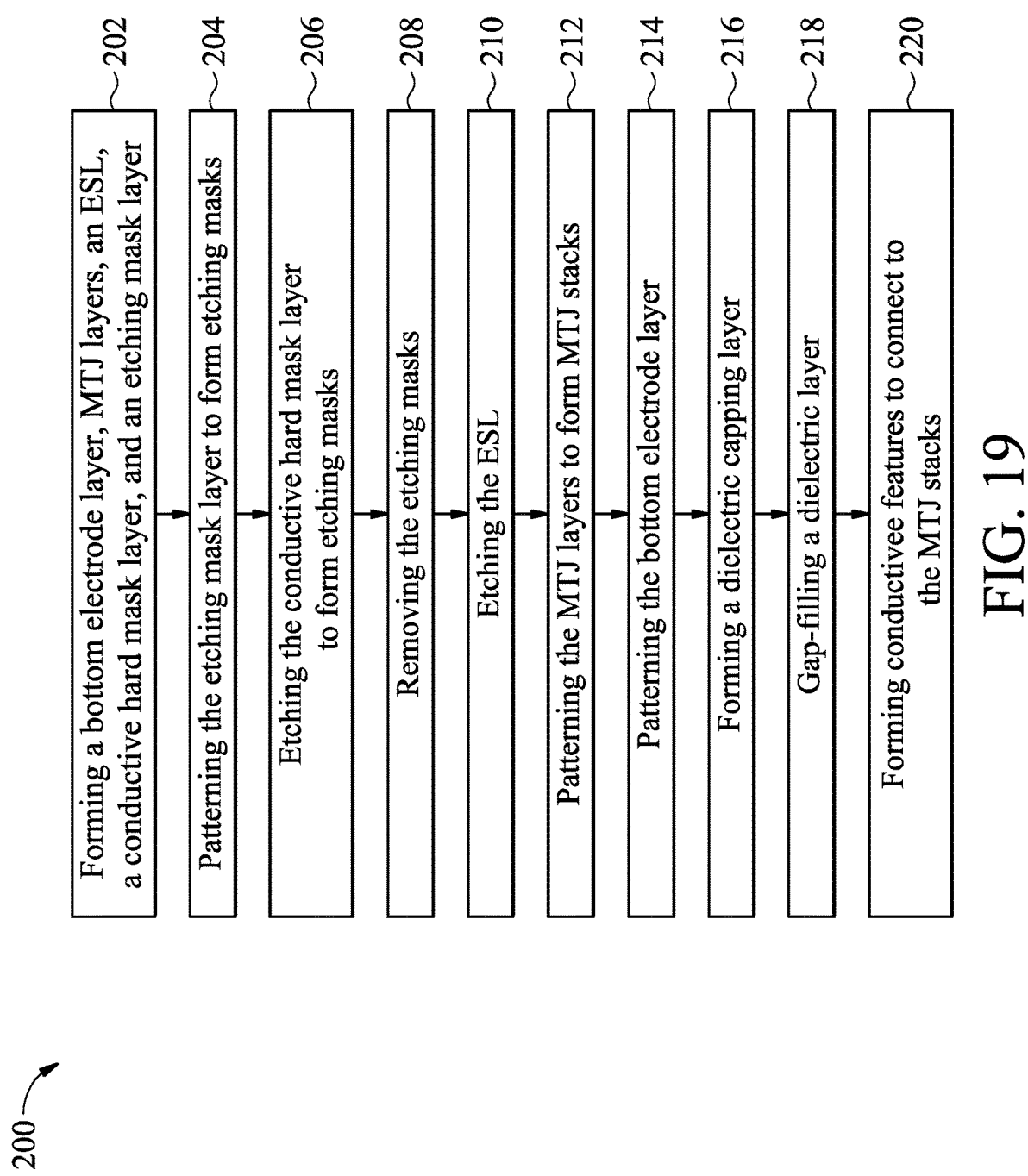

ically in the process flow 200 as shown in FIG. 19.
METAL ETCHING STOP LAYER IN MAGNETIC TUNNEL JUNCTION MEMORY CELLS

PRIORITY CLAIM AND CROSS-REFERENCE

This application is a continuation of U.S. patent application Ser. No. 16/371,784, entitled "Metal Etching Stop Layer in Magnetic Tunnel Junction Memory Cells," filed Apr. 1, 2019, which claims the benefit of the U.S. Provisional Application No. 62/738,529, filed Sep. 28, 2018, and entitled "Metal Etching Stop Layer in Magnetic Tunnel Junction Memory Cells," which applications are hereby incorporated herein by reference.

BACKGROUND

Semiconductor memories are used in integrated circuits for electronic applications, including radios, televisions, cell phones, and personal computing devices, as examples. One type of semiconductor memory device is Magneto-Resistive Random Access Memory (MRAM), which involves spin electronics that combines semiconductor technology and magnetic materials and devices. The spins of electrons, through their magnetic moments, rather than the charge of the electrons, are used to store bit values.

A typical MRAM cell may include a Magnetic Tunnel Junction (MTJ) stack, which includes a pinning layer, a pinned layer over the pinning layer, a tunnel layer over the pinned layer, and a free layer over the tunnel layer. During the formation of the MRAM cell, a plurality of blanket layers are deposited first. The blanket layers are then patterned through a photo etching process to form the MTJ stack. A dielectric capping layer is then formed to protect the dielectric capping layer. The dielectric capping layer includes some portions on the sidewalls, and possibly additional portions over the top surface, of the MTJ stack.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 19 illustrates a process flow for forming MRAM cells in accordance with some embodiments.

DETAILED DESCRIPTION

Figure 1:
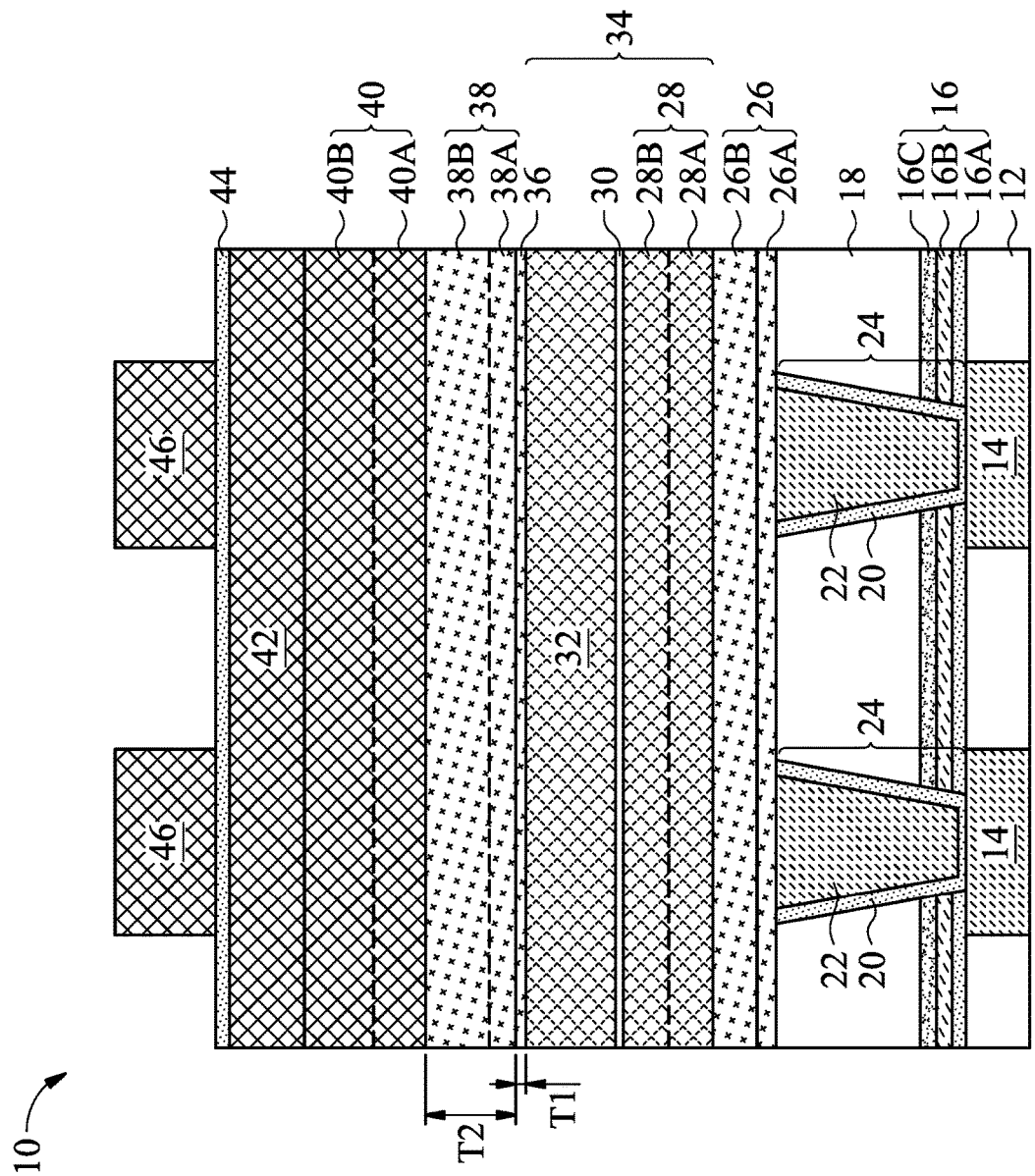
FIGS. 1 through 10 are cross-sectional views of intermediate stages in the formation of some Magneto-Resistive Random Access Memory (MRAM) cells in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Magneto-Resistive Random Access Memory (MRAM) cells and the methods of forming the same are provided in accordance with some embodiments. The intermediate stages of forming the MRAM cells are illustrated in accordance with some embodiments. Some variations of some embodiments are discussed. Throughout the various views and illustrative embodiments, like reference numbers are used to designate like elements. In accordance with some embodiments of the present disclosure, conductive materials having high etching selectivity values are used as the etch stop layers and the hard masks, so that smaller recesses are formed in the etch stop layers and transferred to underlying dielectric layers, and the manufacturing cost is lowered.

FIGS. 1 through 10 illustrate the cross-sectional views of intermediate stages in the formation of MRAM cells in accordance with some embodiments of the present disclosure. The processes shown in FIGS. 1 through 10 are also reflected schematically in the process flow 200 as shown in FIG. 19.

Referring to FIG. 1, wafer 10 is formed. Wafer 10 may include a substrate (not shown), which may be a semiconductor substrate. The substrate may be formed of silicon, silicon germanium, III-V compound semiconductor, or the like. In accordance with some embodiments of the present disclosure, the substrate is a bulk silicon substrate. Active devices (not shown) such as transistors and diodes and passive devices (not shown) such as capacitors, inductors, and resistors may be formed in wafer 10. Dielectric layer 12 is formed over the substrate. In accordance with some embodiments of the present disclosure, dielectric layer 12 is a low-k dielectric layer having a dielectric constant (k value) lower than about 3.0, for example. Dielectric layer 12 may also be formed of another dielectric material such as silicon oxide, silicon nitride, Phospho-Silicate Glass (PSG), Boro-Silicate Glass (BSG), Boron-Doped Phospho-Silicate Glass (BPSG), or the like. Conductive features 14 are formed in dielectric layer 12. In accordance with some embodiments of the present disclosure, conductive features 14 are metal lines (such as word lines or bit lines), metal vias, contact plugs, doped semiconductor strips, or the like. Metal features 14 may be formed of metals such as copper, aluminum, tungsten, cobalt, or the like, or metal alloys thereof.

Over conductive features 14 may be etch stop layer 16, dielectric layer 18, and conductive features 24. In accordance with some embodiments of the present disclosure, etch stop layer 16 is formed of a dielectric layer that is different from the overlying dielectric layer 18. For example, etch stop layer 16 may be formed of aluminum nitride, aluminum oxide, silicon oxide, silicon nitride, silicon oxynitride, silicon carbide, silicon carbo-nitride, or the like. Etch stop layer 16 may also be a composite layer including a plurality of dielectric layers. For example, etch stop layer 16 may include SiC or SiCN layer 16A, metal nitride layer or metal oxide layer (such as an AlN or $AlO_x$ layer) 16B over the metal oxide layer 16A, and may or may not include metal oxynitride layer 16C or metal carbo-nitride layer 16C over the metal nitride layer 16B.

Dielectric layer 18 may be formed of silicon oxide deposited using, e.g., a Chemical Vapor Deposition (CVD) method with Tetra Ethyl Ortho Silicate (TEOS) as a precursor. Dielectric layer 18 may also be formed using PSG, BSG, BPSG, Undoped Silicate Glass (USG), Fluorosilicate Glass (FSG), SiOCH, flowable oxide, porous oxide, or the like, or combinations thereof in accordance with other embodiments. Dielectric layer 18 may also be formed of a low-k dielectric material with a k value lower than about 3.0, for example.

Conductive features 24 are formed in dielectric layer 18 and penetrate through etch stop layer 16. Conductive features 24 may be metal lines, vias, contact plugs, or the like. In accordance with some embodiments of the present disclosure, conductive features include conductive barrier layers 20 and conductive regions 22 over the bottom portion of conductive barrier layers 20. Conductive barrier layers 20 may be formed of titanium, titanium nitride, tantalum, tantalum nitride, cobalt, or the like. Conductive regions 22 may be formed of metals such as copper, aluminum, tungsten, cobalt, or the like, or alloys of the metals. The formation of conductive features 24 may include etching dielectric layer 18 and etch stop layer 16 to form via openings, forming a blanket conductive barrier layer extending into the via openings, depositing a metallic material over the blanket conductive barrier layer, and performing a planarization process such as a Chemical Mechanical Polish (CMP) process or a mechanical grinding process to remove excess portions of the blanket conductive barrier layer and the metallic material.

Next, a bottom electrode layer, MTJ layers, an etch stop layer, a conductive hard mask layer, and an etching mask layer are formed consecutively. The respective processes are illustrated as process 202 in the process flow show in FIG. 19. Further referring to FIG. 1, bottom electrode layer 26 is deposited. In accordance with some embodiments of the present disclosure, bottom electrode layer 26 is formed as a blanket layer, and may be formed using CVD, Physical Vapor Deposition (PVD), Electro-Chemical Plating (ECP), Electroless plating, or the like. The material of bottom electrode layer 26 may include Cu, Al, Ti, Ta, W, Pt, Ni, Cr, Ru, Co, $Co_xFe_yB_zW_w$, TiN, TaN, combinations thereof, and/or multi-layers thereof. For example, bottom electrode layer 26 may include titanium nitride layer 26A and TiN layer 26B over layer 26A.

Over bottom electrode layer 26, MTJ layers 34 are formed. In accordance with some embodiments of the present disclosure, MTJ layers 34 include bottom magnetic layer 28, tunnel barrier layer 30 over bottom magnetic layer 28, and top magnetic layer 32 over tunnel barrier layer 30. Bottom magnetic layer 28 may include pinning layer 28A and pinned layer 28B over and contacting pinning layer 28A. Top magnetic layer 32 may include a free layer. The neighboring layers in layers 28, 30, and 32 may also be in physical contact with each other. Bottom magnetic layer 28, tunnel barrier layer 30, and top magnetic layer 32 may be deposited using one or more deposition methods such as, CVD, PVD, ALD, or the like.

Pinning layer 28A may be formed of a metal alloy including manganese (Mn) and another metal(s) such as platinum (Pt), iridium (Ir), rhodium (Rh), nickel (Ni), palladium (Pd), iron (Fe), osmium (Os), or the like. Accordingly, pinning layer 28A may be formed of PtMn, IrMn, RhMn, NiMn, PdPtMn, FeMn, OsMn, or the like. Pinned layer 28B may be formed of a ferromagnetic material with a greater coercivity field than top magnetic layer 32, and may be formed of materials such as cobalt iron (CoFe), cobalt iron boron (CoFeB), or the like. In accordance with some embodiment, pinned layer 28B has a Synthetic ferromagnetic (SFM) structure, in which the coupling between magnetic layers is ferromagnetic coupling. Magnetic layer 28 may also adopt a Synthetic Antiferromagnetic (SAF) structure including a plurality of magnetic metal layers separated by a plurality of non-magnetic spacer layers. The magnetic metal layers may be formed of Co, Fe, Ni, or the like. The non-magnetic spacer layers may be formed of Cu, Ru, Ir, Pt, W, Ta, Mg, or the like. For example, Magnetic layer 28 may have a Co layer and repeated $(Pt/Co)_x$ layers over the Co layer, with x representing repeating number and may be any integer equal to or greater than 1.

Tunnel barrier layer 30 may be formed of MgO, AlO, AlN, or the like. Tunnel barrier layer 30 may have a thickness in the range between about 0.5 nm and about 3 nm.

Top magnetic layer 32 may be formed of a ferromagnetic material such as CoFe, NiFe, CoFeB, CoFeBW, or the like. Top magnetic layer 32 may also adopt a synthetic ferromagnetic structure, which is similar to the SAF structure, with the thickness of the spacer layer adjusted to achieve the ferromagnetic coupling between the separated magnetic metals, i.e, causing the magnetic moment to be coupled in the same direction. The magnetic moment of top magnetic layer 32 is programmable, and the resistance of the resulting MTJ cell is accordingly changed between a high resistance and a low resistance. It is realized that the materials and the structure of MTJ layers 34 may have many variations, which are also within the scope of the present disclosure. For example, layers 28A, 28B, 30, and 32 may be formed in an order inversed from what is shown in FIG. 1. Accordingly, the free layer may be the bottom layer of MTJ layers 34, while the pinning layer 28A may be the top layer.

Conductive Etch Stop Layer (ESL) 36 is formed over and contacting MTJ layers 34. In accordance with some embodiments of the present disclosure, conductive ESL 36 is formed as a blanket layer, and may be formed using CVD, PVD, ECP, Electroless plating, or the like. The material of conductive ESL 36 may include tungsten, ruthenium, the composite layer including a tungsten layer and a ruthenium overlying or underlying the tungsten layer, and/or alloys of tungsten and ruthenium. For example, when conductive ESL 36 includes the tungsten layer, the corresponding deposition process may include a CVD process using $WF_6$ as one of process gases. The thickness T1 of conductive ESL 36 may be smaller than about 10 nm, and may be in the range between about 5 nm and about 50 nm. When formed of tungsten or ruthenium, the atomic percentage of tungsten or ruthenium in ESL layer 36 may be higher than about 80 percent, for example.

Hard mask layer 38 is deposited over conductive ESL 36, and is formed using a conductive material. In accordance with some embodiments of the present disclosure, hard mask layer 38 is formed as a blanket layer, and may be formed using CVD, PVD, Electro-Chemical Plating (ECP), E-less plating, or the like. The material of hard mask layer 38 may include titanium, titanium nitride, tantalum, tantalum nitride, tungsten, tungsten carbide, combinations thereof, or multi-layers thereof. Hard mask layer 38 may also be formed of other conductive material that have different etching characteristics than conductive ESL layer 36, so that conductive ESL layer 36 may effectively stop the etching of hard mask layer 38. When ESL is formed of ruthenium, hard mask layer 38 may also be formed of tungsten or tungsten carbide. Hard mask layer 38 may be used as an etching mask in the subsequent patterning of MTJ layer. Alternatively stated, the material of the hard mask layer 38 can be categorized into two groups: those including tungsten, such as the alloy of tungsten with one or more of Ta, TaN, Ti, TiN or the multi-layers with at least one layer including tungsten or a tungsten alloy, and those without tungsten, such like Ta, TaN, Ti, TiN, combinations thereof, or multi-layers thereof. When tungsten is utilized in the hard mask layer 38, ruthenium may be utilized as the etching stop layer, and when tungsten is not utilized in the hard mask layer 38, tungsten, ruthenium, or their combination/multi-layer may be utilized as the etching stop layer.

The thickness T2 of hard mask layer 38 may be in the range between about 30 nm and about 150 nm. Furthermore, since conductive ESL 36 is used for stopping the etching of hard mask layer 38, thickness T2 of hard mask layer 38 is significantly greater than thickness T1 of conductive ESL 36. For example, ratio T2/T1 may be greater than about 3, and may be in the range between about 3 and about 30.

In accordance with some embodiments of the present disclosure, hard mask layer 38 is formed of a homogenous conductive material such as titanium, titanium nitride, tantalum, tantalum nitride, tungsten, tungsten carbide, tungsten boron carbide, or combinations thereof. In accordance with alternative embodiments of the present disclosure, hard mask layer 38 includes conductive hard mask (sub) layer 38A, and conductive hard mask (sub) layer 38B over conductive hard mask (sub) layer 38A. Conductive hard mask layers 38A and 38B are formed of different materials and have different etching properties, and each of conductive hard mask layers 38A and 38B may be formed of a homogenous material. For example, conductive hard mask layer 38A may be formed of tungsten, while conductive hard mask layer 38B may be formed of titanium, titanium nitride, tantalum, tantalum nitride, or the like.

Etching mask layer 40 is formed over conductive hard mask layer 38. In accordance with some embodiments, etching mask layer 40 is formed of a dielectric material such as silicon oxide, silicon nitride, amorphous carbon, or the like, or multi-layers thereof. For example, FIG. 1 illustrates an example in which etching mask layer 40 includes etching mask (sub-layer) 40A and etching mask (sub-layer) 40B over etching mask layer 40A. In accordance with some embodiments of the present disclosure, etching mask layer 40A is formed of silicon oxide, which may be formed of using Tetraethyl orthosilicate (TEOS), and etching mask layer 40B is formed of amorphous carbon.

Over etching mask layer 40, a tri-layer is formed, which includes bottom layer 42 (sometimes referred to as a under layer), middle layer 44 over bottom layer 42, and top layer 46 over middle layer 44. In accordance with some embodiments of the present disclosure, bottom layer 42 may be formed of a photo resist or another type of material such as SiON or amorphous carbon (also sometimes referred to as Ash Removable Dielectric (ARD)). Furthermore, bottom layer 42, when formed of photo resist, may be cross-linked, and hence is different from typical photo resists used for light exposure. Bottom layer 42 may function as a Bottom Anti-Reflective Coating (BARC) when top layer 46 is light-exposed.

Middle layer 44 may be formed of a material including silicon and oxygen, which may be SiON, for example, while other similar materials may be used. Top layer 46 may be formed of a photo resist. Top layer 46 is coated as a blanket layer, and is then patterned in a photo lithography process using a photo lithography mask (not shown) that includes opaque portions and transparent portions. In a top view of wafer 10, the remaining portions of top layer 46 may be allocated as an array.

In accordance with some embodiments, etching mask layer 40 is omitted, and the tri-layer including bottom layer 42, middle layer 44, and top layer 46 is formed on hard mask layer 38 directly.

Figure 2:
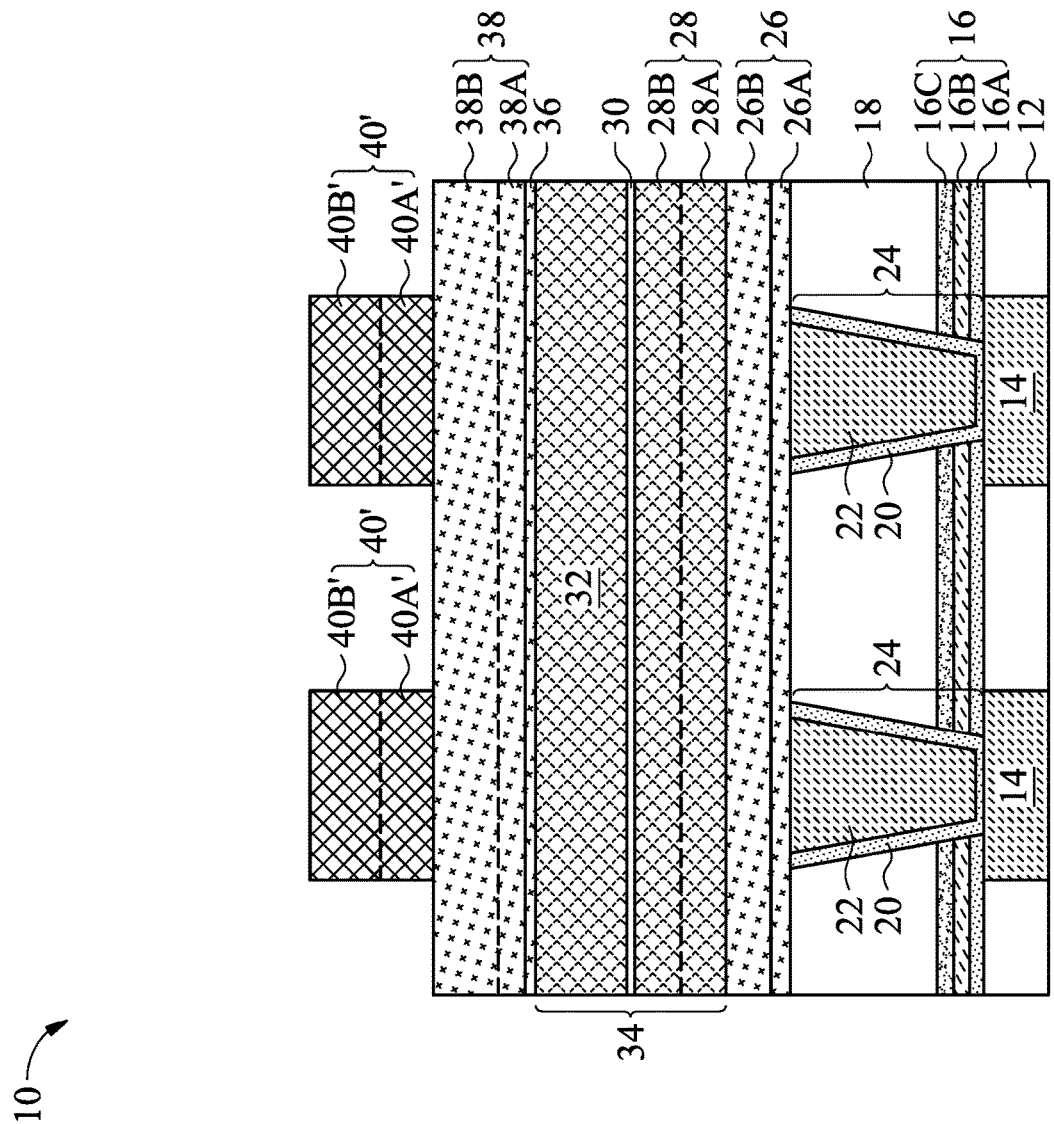

In subsequent steps, the patterned top layer 46 is used as an etching mask to etch and pattern the underlying middle layer 44 and bottom layer 42, and etching mask layer 40 (if formed). The patterning of etching mask layer 40 is illustrated as process 204 in the process flow show in FIG. 19. The patterned top layer 46 may be consumed in the etching process. After the patterning of etching mask layer 40, the remaining portions 40' (referred to as etching masks 40' hereinafter) of etching mask layer 40 are left, as shown in FIG. 2. The remaining portions of the tri-layer (FIG. 1) are then removed. In the embodiments in which etching mask layer 40 is not formed, the tri-layer will include at least some remaining portions of bottom layer 42, which define the patterns of the future MTJ cells.

Figure 3:
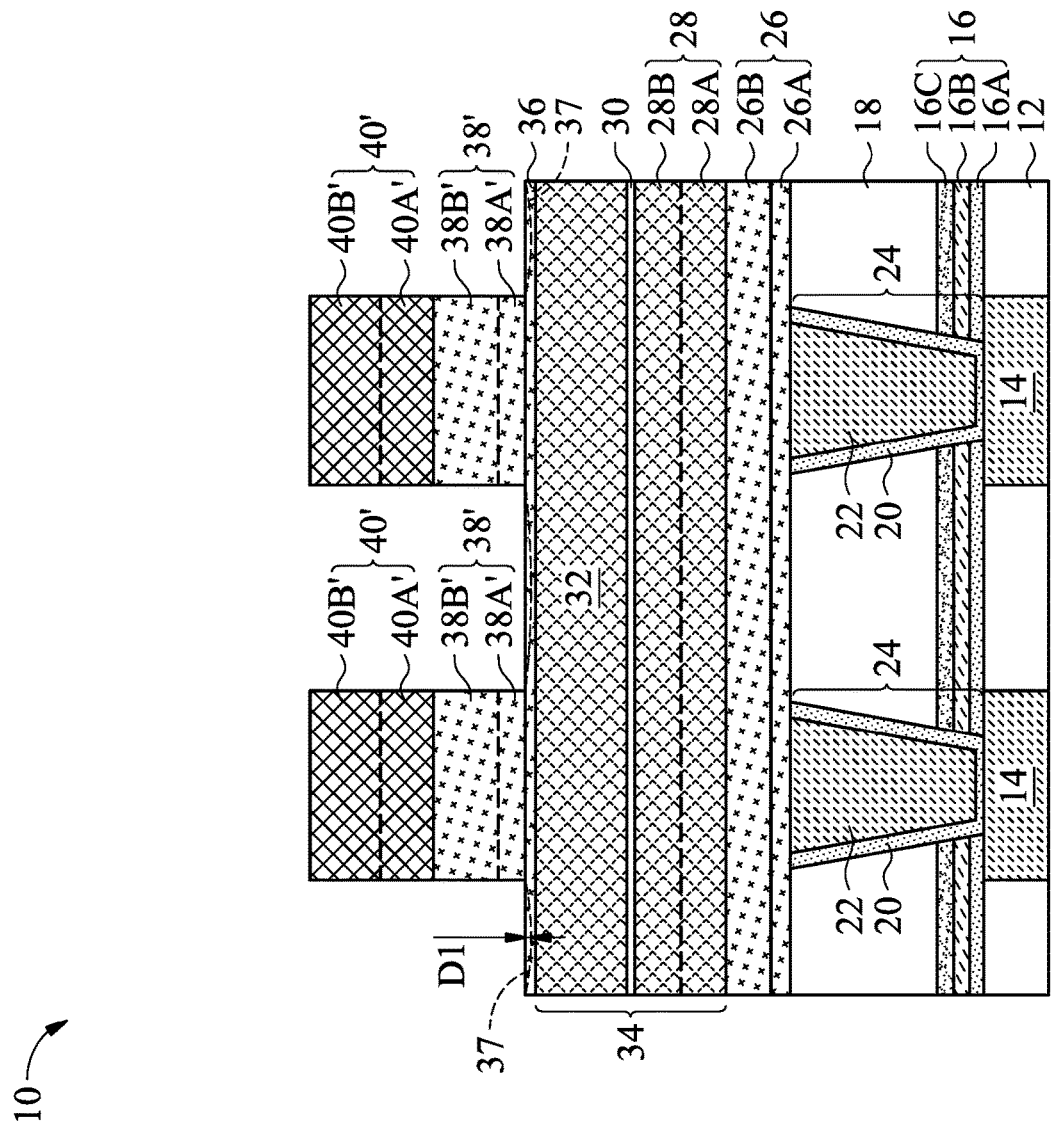

In a subsequent step, etching masks 40' are used as an etching mask to etch the underlying conductive hard mask layer 38, forming hard masks 38' (which includes sub hard masks 38A' and 38B'), as shown in FIG. 3. The respective process is illustrated as process 206 in the process flow show in FIG. 19. The etching stops on ESL layer 36. The resulting hard masks 38' are illustrated in FIG. 3. The etching method may include a plasma etching method, which may include reactive Ion Beam Etching (IBE). The etching may be implemented using Glow Discharge Plasma (GDP), Capacitive Coupled Plasma (CCP), Inductively Coupled Plasma (ICP), or the like. In accordance with some embodiments of the present disclosure, Reactive Ion Etching (RIE), rather than IBE, may be used in the etching of hard mask layer 38. In accordance with alternative embodiments in which etching mask layer 40 (and hence hard masks 40') is skipped, the etching is performed using the remaining portions of the tri-layer 42/44/46 as the etching mask.

In accordance with some embodiments of the present disclosure, the etching of hard mask layer 38 is performed using process gases selected from $Cl_2$, $N_2$, $CH_4$, He, $CH_xF_y$, $SF_6$, $NF_3$, $BCl_3$, $O_2$, Ar, $C_xF_y$, HBr, or the combinations thereof. $N_2$, Ar and/or He may be used as carrier gases. For example, for etching titanium, titanium nitride, tantalum, tantalum nitride, or the like in hard mask layer 38, $Cl_2$ may be used, along with other gases such as the carrier gas. For etching tungsten (if adopted) in hard mask layer 38, $CH_xF_y$ may be used, along with other gases such as the carrier gas. In accordance with some embodiments of the present disclosure, the ratio of the flow rate of $Cl_2$ to the flow rate of $N_2$ and $CH_4$ is greater than about 10, and may be in the range between about 10 and about 50, or higher. With the flow rate ratio being higher than about 10, the etching selectivity, which is the ratio of the etching rate of hard mask layer 38 to the etching rate of ESL layer 36, is higher than about 10. This ensures that the etching is stopped on ESL layer 36 with very small recess (schematically illustrated as 37) formed to extend into ESL layer 36. For example, when the flow-rate ratio is higher than about 10, the depth D1 of recesses 37 in ESL layer 36 may be smaller than about 7 nm. In accordance with some embodiment, during the etching of hard mask layer 38, a source power is in the range between about 30 volts and about 1,000 volts, and a bias voltage may be in the range between about 0 volt and about 1,000 volts.

In accordance with some embodiments in which hard mask layer 38 includes hard mask layers 38A and 38B, with hard mask layer 38B formed of titanium, titanium nitride, tantalum, or tantalum nitride, and hard mask layer 38A formed of tungsten, a first etching gas (such as $Cl_2$) is used to etch hard mask layer 38B, and then a second etching gas (such as $CH_xF_y$) different from the first etching gas is used to etch tungsten. Accordingly, in the etching of hard mask layer 38B, hard mask layer 38A at least slows down the downward etching, and may act as an etch stop layer when hard mask layer 38B is etched. As a result, the downward etching of hard mask layer 38 is more uniform throughout wafer 10 by using the composite hard mask layer 38.

Figure 4:
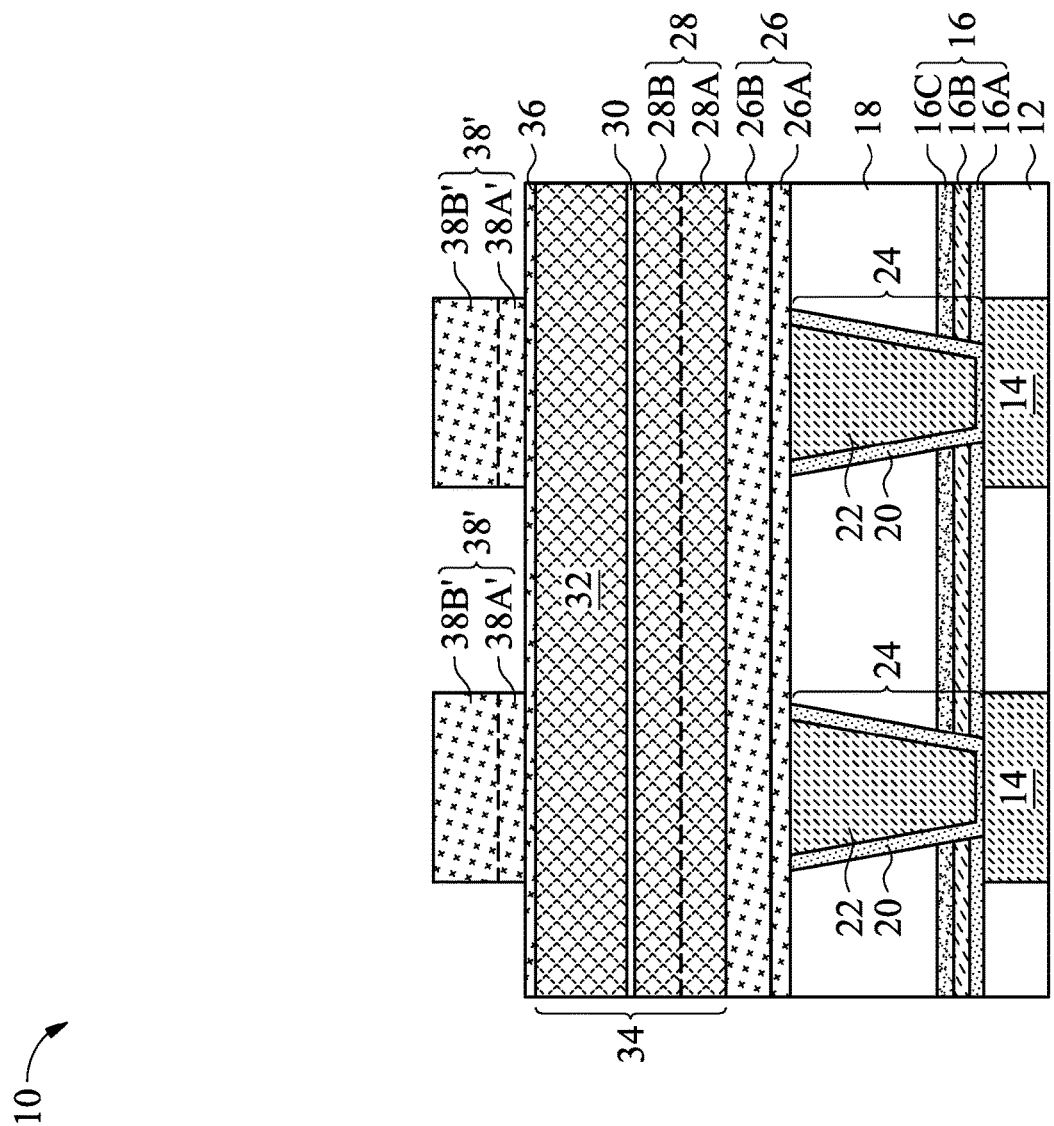
Figure 5:
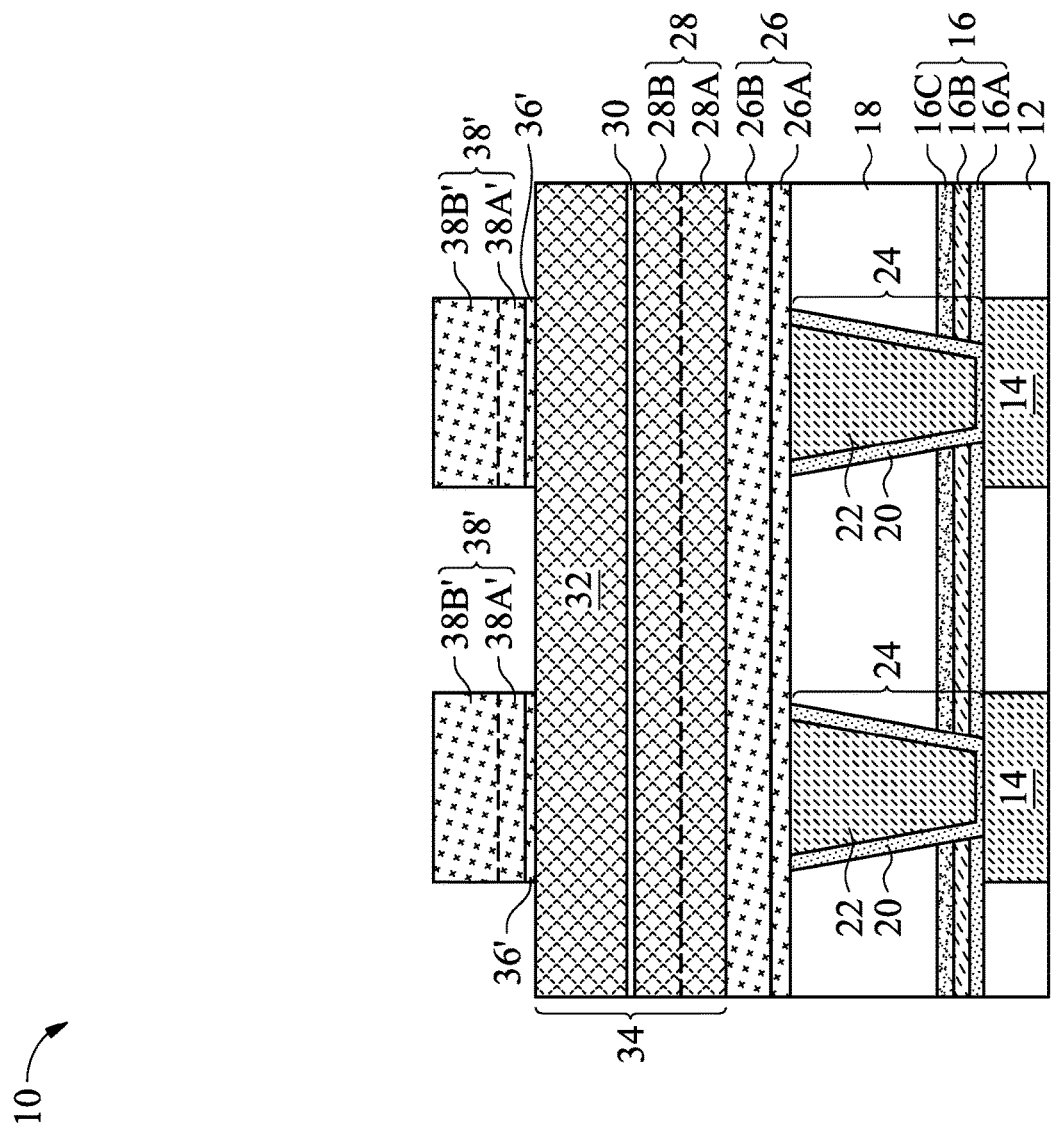

After hard masks 38' are formed, etching masks 40' may be removed, and the resulting structure is shown in FIG. 4. The respective process is illustrated as process 208 in the process flow show in FIG. 19. Next, an etching gas different from the etching gas for etching hard mask layer 38 is used to etch-through conductive ESL 36. The respective process is illustrated as process 210 in the process flow show in FIG. 19. The resulting structure is shown in FIG. 5, with the remaining portions of conductive ESL 36 being denoted as conductive ESLs 36'. In accordance with some embodiments of the present disclosure in which conductive ESL 36 is formed of ruthenium, the etching gas may include $O_2$, and other gases such as Ar, $Cl_2$, and $CF_4$, or the like may be used. In accordance with other embodiments of the present disclosure in which conductive ESL 36 is formed of tungsten, the etching gas may include $CH_xF_y$, with x and y being integers. The etching of conductive ESL 36 may be performed using IBE, RIE, or the like.

Figure 6:
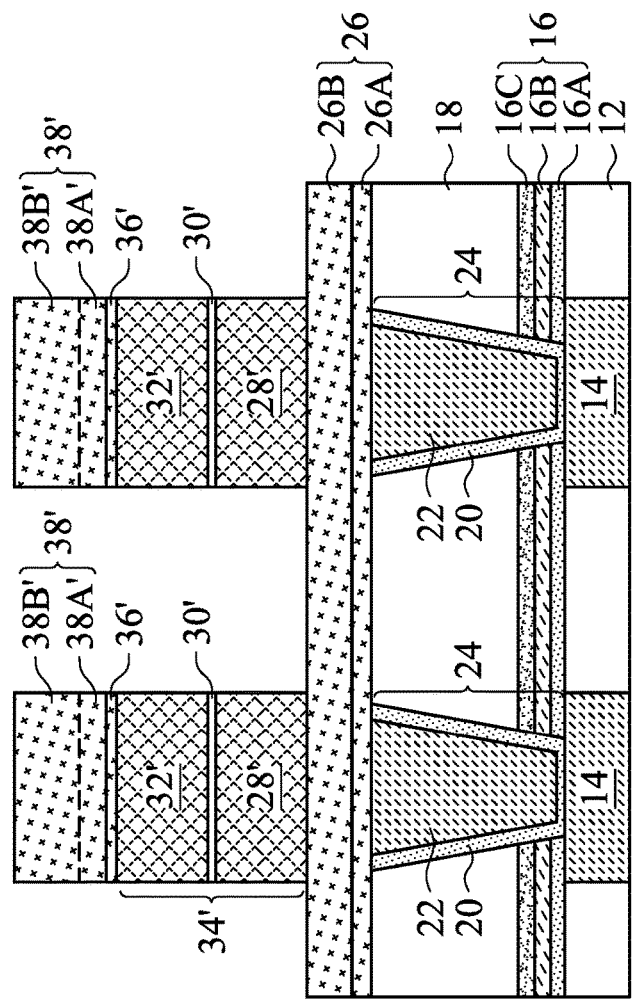

In subsequent process steps, a plurality of etching processes are performed using hard masks 38' as etching masks to etch MTJ layers 34, forming MTJ stacks 34' as shown in FIG. 6. The respective process is illustrated as process 212 in the process flow show in FIG. 19. In accordance with some embodiments of the present disclosure, the etching of the layers in MTJ layers 34 is in-situ performed in the same etching chamber, which is a vacuum chamber configured to be vacuumed. There may or may not be vacuum break between these processes. Alternatively stated, from the beginning to the end of the etching of MTJ layers 34, there may not be vacuum break. Rather, the change from one process to another process is achieved by adjusting process conditions such as changing (and/or adjusting the flow rates of) process gases and adjusting powers/voltages. The adjusted powers/voltages may include the source power (sometimes referred to as coil power) when the IBE is used. The adjusted powers/voltages may also include beam accelerator voltage (grid voltage) if IBE is used for etching, or bias voltage if RIE is used for etching. In accordance with other embodiments, there may be vacuum breaks between these processes, and these processes may be performed in different process chambers.

The etching of MTJ layers 34 may be performed using reactive ion beam etching, which may involve GDP, ICP, CCP, or the like. As a result of the etching process, magnetic layer 32 is etched-through, forming magnetic layers 32'. After the etching of magnetic layer 32, tunnel barrier layer 30 is etched to form tunnel barriers 30'. In accordance with some embodiments of the present disclosure, tunnel barrier layer 30 is etched in the same process for etching magnetic layer 32, and is etched using the same etching gas for etching magnetic layer 32. In accordance with alternative embodiments, tunnel barrier layer 30 may be etched using different etching gases than etching magnetic layer 32.

In accordance with some embodiments of the present disclosure, the etching process gas includes Ar, Kr, Ne, $O_2$, Xe, He, Methanol, CO, $NH_3$, $CH_4$, suitable alcohols, or combinations thereof. In accordance with some embodiments of the present disclosure, the etching is performed with the source power in the range between about 200 Watts and about 1,500 Watts if IBE is used, or in the range between about 900 Watts and about 2,000 Watts if RIE is used. The bias voltage may be in the range between about 0 volt (which means the bias power is turned off) and about 1,500 volts if RIE is used. If IBE is used, the grid voltage may be in the range between about 50 volts and about 1,500 voltages also.

After the etching of tunnel barrier layer 30, magnetic layer 28 is etched, and magnetic layers 28' are formed. Accordingly, MTJ stacks 34' are formed, with each of the MTJ stacks 34' including bottom magnetic layer 28' and the corresponding overlying tunnel barrier 30' and top magnetic layer 32'. Bottom electrode layer 28 is thus exposed. The etching of magnetic layer 28 may be performed using an ion beam etching process (such as a reactive ion etching process). In accordance with some embodiments of the present disclosure, the etching process gases include Ar, Kr, Ne, $O_2$, Xe, He, Methanol, CO, $NH_3$, $CH_4$, other suitable alcohols, or combinations thereof. In accordance with some embodiments of the present disclosure, the etching is performed with main power (for generating plasma) in the range between about 200 Watts and about 1,500 Watts. The bias energy may be in the range between about 50 eV and about 1,500 eV.

Figure 7:
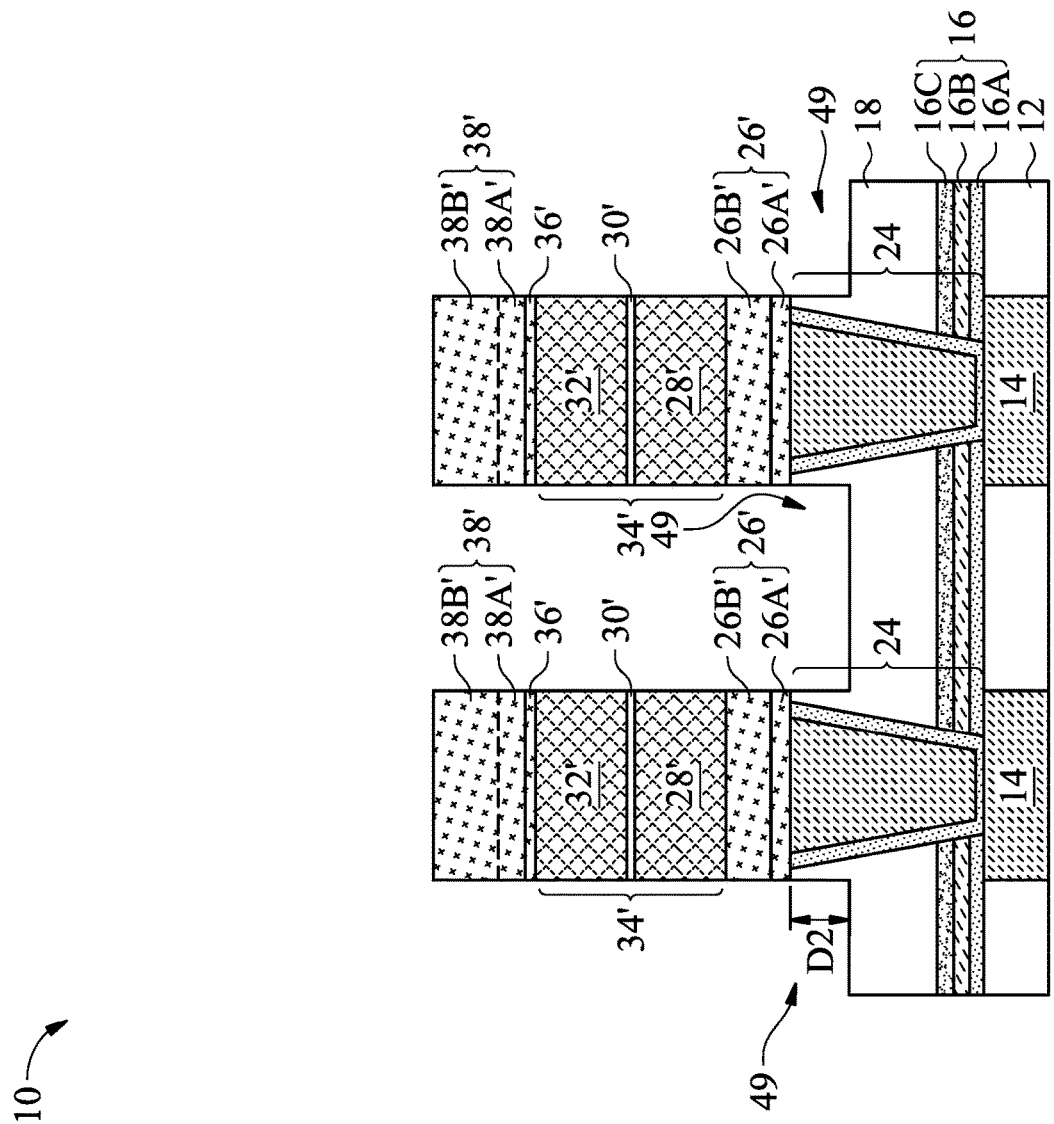

In a subsequent process, bottom electrode layer 26 is etched to form bottom electrodes 26'. The resulting structure is shown in FIG. 7. The respective process is illustrated as process 214 in the process flow show in FIG. 19. The etching may be performed using an ion beam etching process (such as a reactive ion etching process). In accordance with some embodiments of the present disclosure, the etching process gases include Ar, Kr, Ne, $O_2$, Xe, He, Methanol, CO, $NH_3$, $CH_4$, other suitable alcohols, or combinations thereof. In accordance with some embodiments of the present disclosure, the etching is performed with main power (for generating plasma) in the range between about 200 Watts and about 1,500 Watts. The bias energy may be in the range between about 50 eV and about 1,500 eV.

As shown in FIG. 7, when etching bottom electrode layer 26, over-etch may cause recesses 49 to be formed extending into dielectric layer 18. Such recesses are partially due to the recessing of ESL 36 as a result of the etching of the overlying layer (such as 38). Furthermore, the recessing depth D1 (FIG. 3) of ESL 36 may be magnified (and may be doubled) to result in a greater depth D2 in dielectric layer 18. In accordance with the embodiments of the present disclosure, by selecting appropriate materials for forming conductive ESL 36 and the overlying hard mask layer 38 to have a high etching selectivity, the recessing depth D1 (FIG. 3) in ESL 36 is reduced, and accordingly the recessing depth D2 (FIG. 7) in dielectric layer 18 is reduced. In accordance with some embodiments of the present disclosure, the depth D2 of recesses 49 is smaller than about 40 nm, or smaller than about 10 nm.

Figure 8:
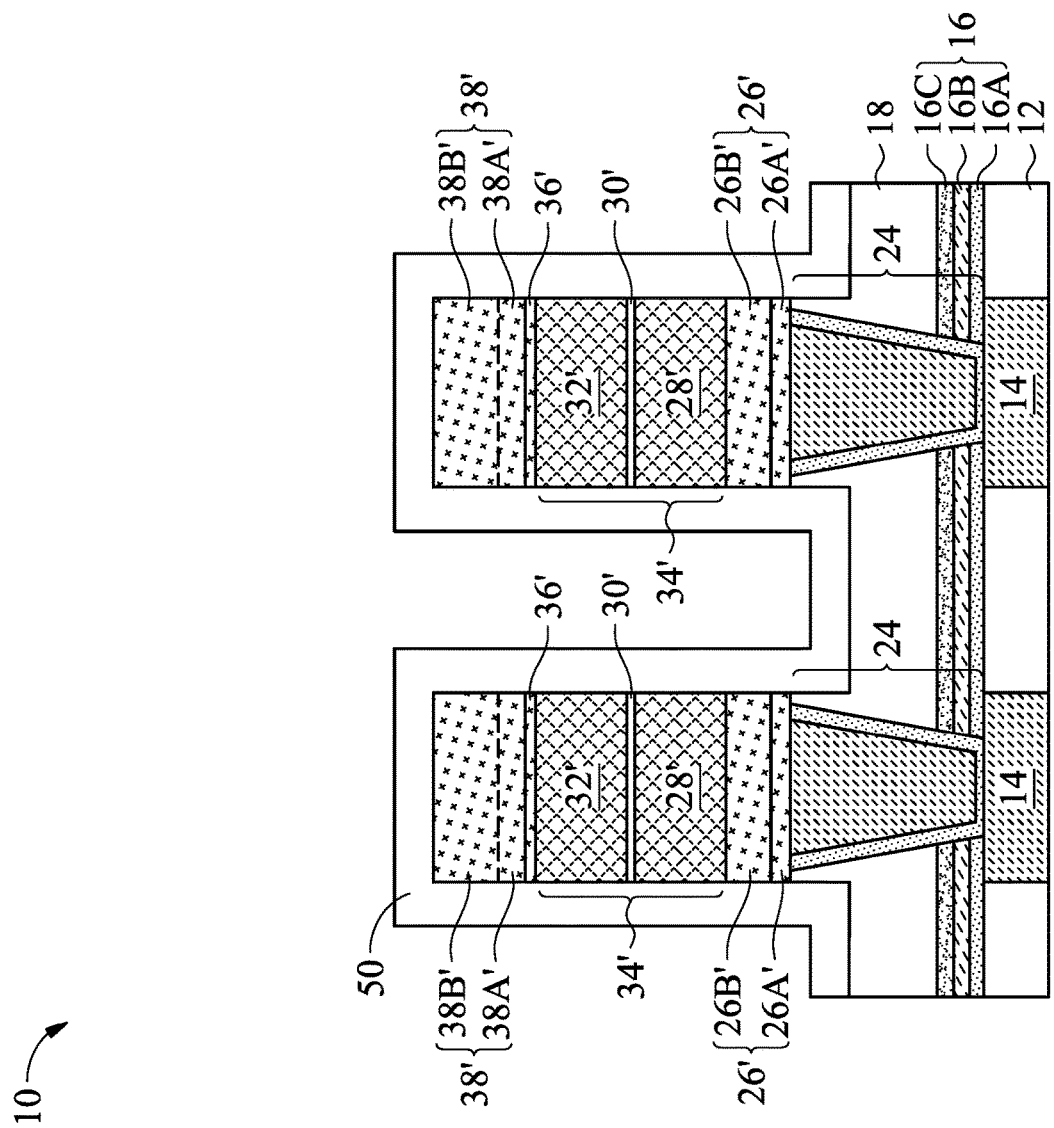

FIG. 8 illustrates the formation of dielectric capping layer 50 in accordance with some embodiments. The respective process is illustrated as process 216 in the process flow show in FIG. 19. In accordance with some embodiments of the present disclosure, dielectric capping layer 50 is formed of silicon nitride, silicon oxynitride, or the like. The formation process may be a CVD process, an ALD process, a Plasma Enhance CVD (PECVD) process, or the like. Dielectric capping layer 50 may be formed as a conformal layer.

Figure 9:
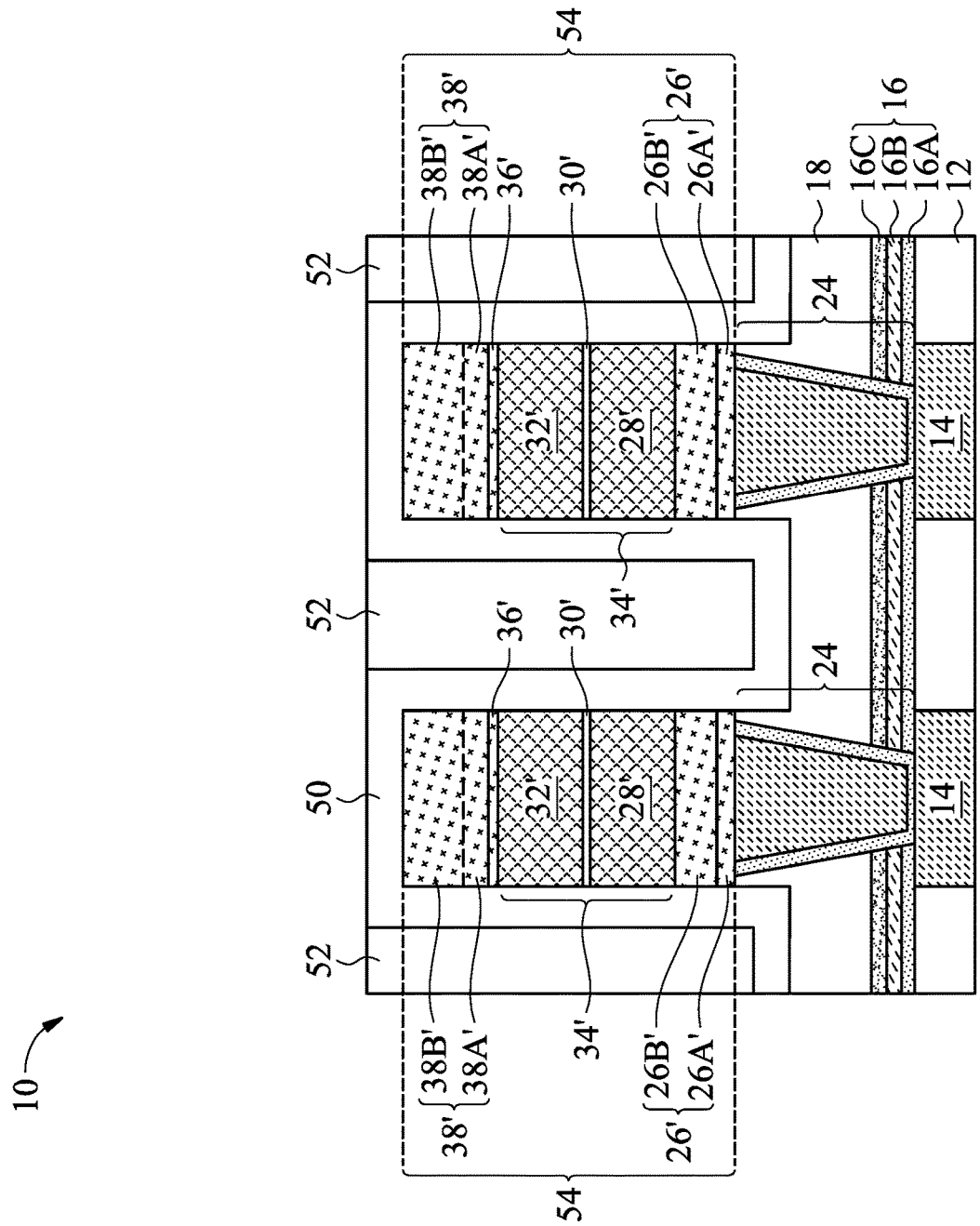

FIG. 9 illustrates a gap-filling process, in which dielectric material 52 is filled into the gaps between MTJ stacks 34'. The respective process is illustrated as process 218 in the process flow show in FIG. 19. Dielectric material 52 may be a TEOS oxide, PSG, BSG, BPSG, USG, FSG, SiOCH, flowable oxide, a porous oxide, or the like, or combinations thereof. Dielectric material 52 may also be formed of a low-k dielectric material. The formation method may include CVD, PECVD, ALD, FCVD, spin-on coating, or the like. After the gap-filling process, a planarization process such as a CMP process or a mechanical grinding process may be performed. The planarization process may be performed using dielectric capping layer 50 or conductive masks 38' as CMP stop layer. Accordingly, the top surface of dielectric material 52 may be level with the top surface of dielectric capping layer 50 or the top surfaces of conductive masks 38'. MRAM cells 54 are thus formed.

Figure 10:
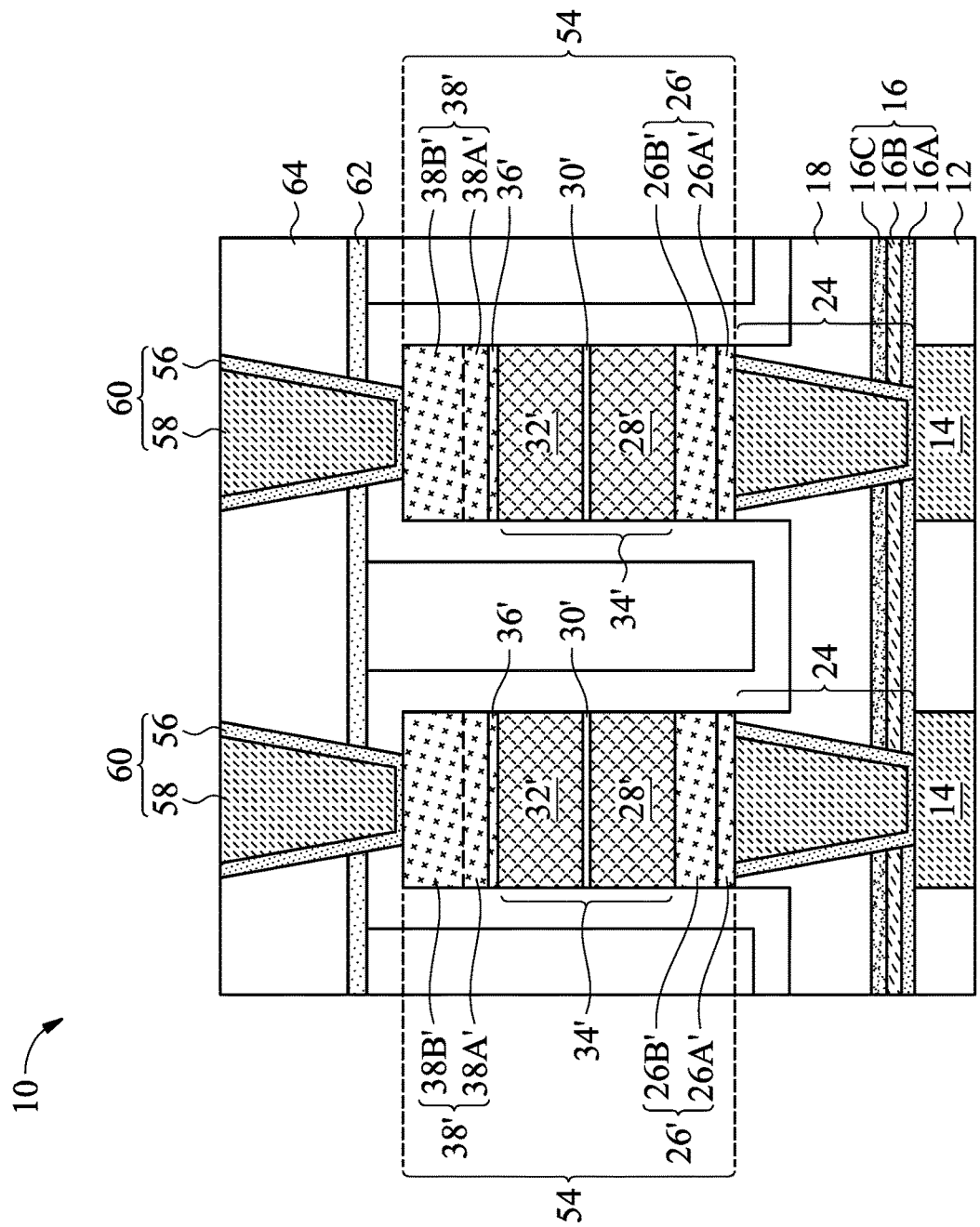

FIG. 10 illustrates the structure after the formation of conductive features 60, which may be vias, conductive lines (which may be word lines or bit lines), or the like. The respective process is illustrated as process 220 in the process flow show in FIG. 19. In accordance with some embodiments of the present disclosure, conductive features 60 include barrier layers 56 and conductive regions 58 over barrier layer 68. Conductive barrier layers 56 may be formed of titanium, titanium nitride, tantalum, tantalum nitride, Co, or the like. Conductive regions 58 may be formed of metals such as copper, aluminum, tungsten, cobalt, or the like, or alloys of these metals. Conductive features 60 are formed in etch stop layer 62 and dielectric layer 64. Conductive features 60 are electrically coupled to conductive hard masks 38'. In the structure shown in FIG. 10, conductive ESLs 36' and conductive hard masks 38' in combination act as the top electrodes 66 of the resulting MRAM cells 54.

Figure 10A:
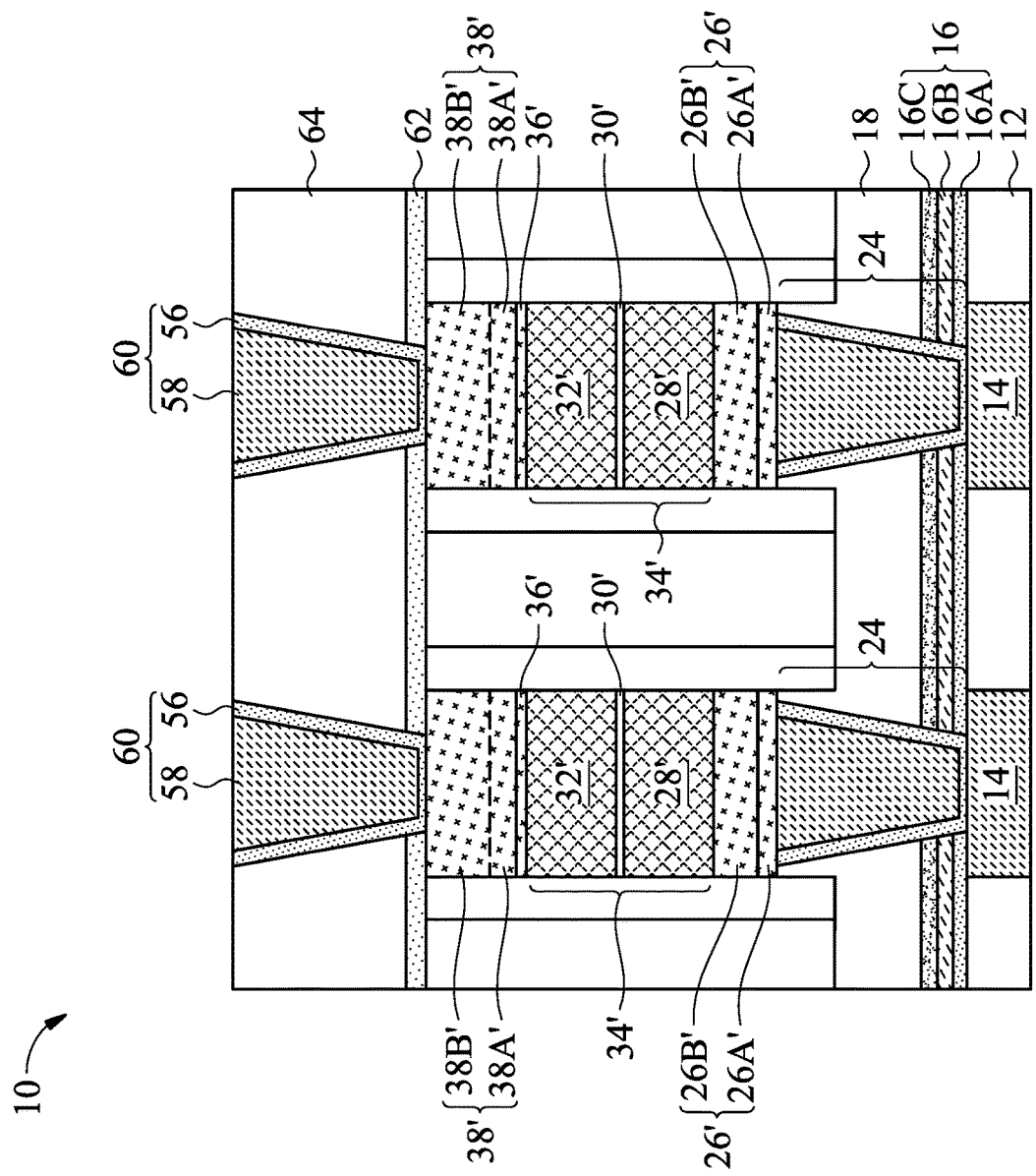
FIGS. 10A and 10B illustrate some Magneto-Resistive Random Access Memory (MRAM) cells in accordance with some embodiments.
Figure 10B:
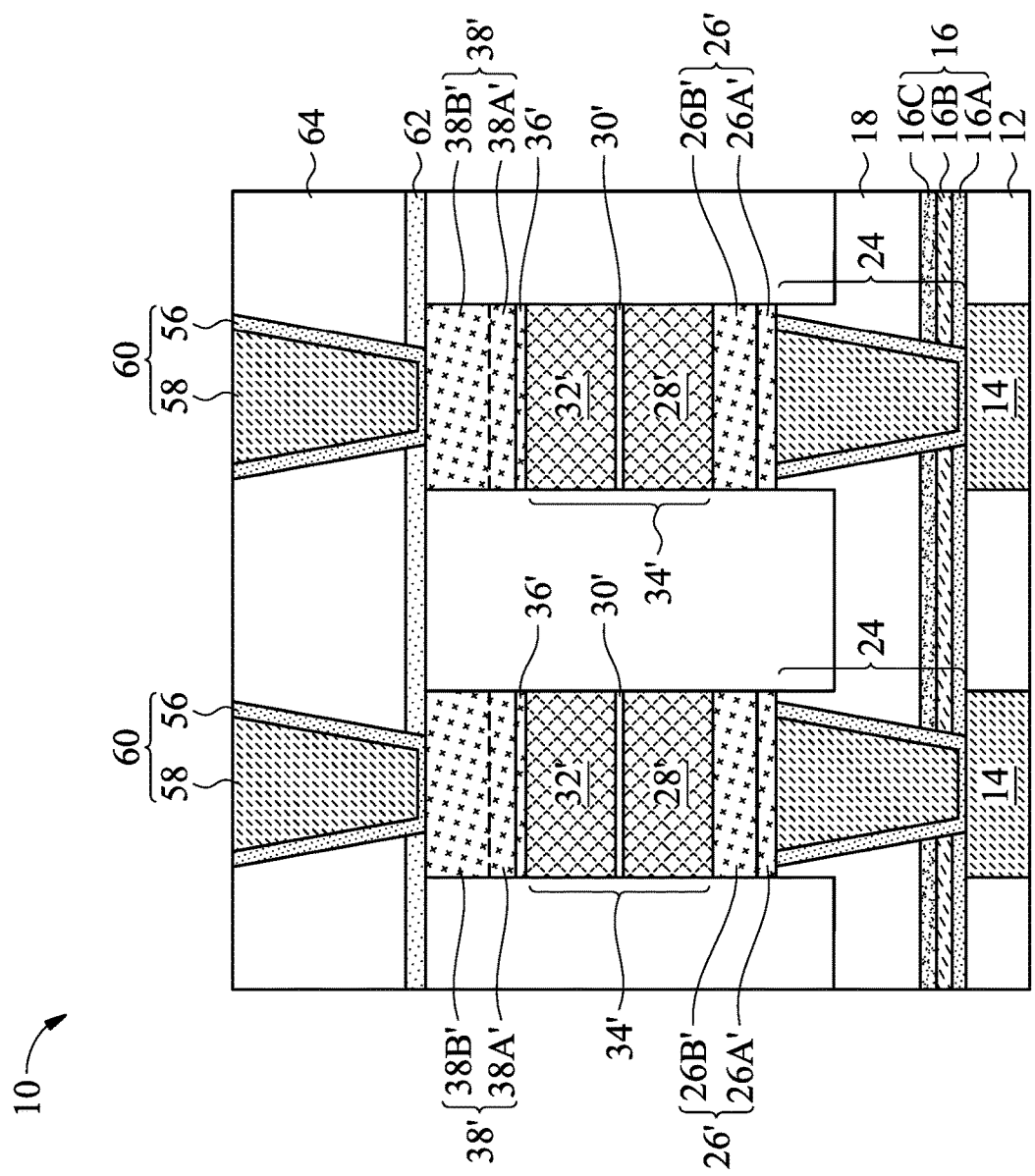

In accordance with some embodiments, after the formation of dielectric capping layer 50 as shown in FIG. 8, a spacer etching process is performed, so that conductive masks 38' is exposed. Some portions of material 50 near the recess 49 (FIG. 7) may be removed or partially removed. Gap filling material 52 may then be formed for isolation, followed by a CMP process. After the CMP process, conductive masks 38' is exposed, which is surrounded by the spacer, which is the remaining portion of the etched dielectric capping layer 50. FIG. 10A illustrates a resulting structure. FIG. 10B illustrates an alternative structure in which the dielectric capping layer 50 is skipped. As shown in FIGS. 10, 10A and 10B, ESL 36' remains as a part of the final structure, and the existence of ESL 36' may be detected using material analysis methods such as Secondary ion mass spectrometry (SIMS), energy dispersive X-ray spectroscopy (EDX), Auger electron (AES), or the like.

The processes as shown in FIGS. 1 through 10 may be integrated with the formation of logic dies. For example, FIGS. 11 through 18 illustrate the integration of the formation of MRAM cells 54 as shown in FIGS. 1 through 10 with the formation of metal layers and the corresponding dielectric layers. Unless specified otherwise, the materials and the formation processes of the components in these embodiments are essentially the same as the like components, which are denoted by like reference numerals in the embodiments shown in FIGS. 1 through 10.

Figure 11:
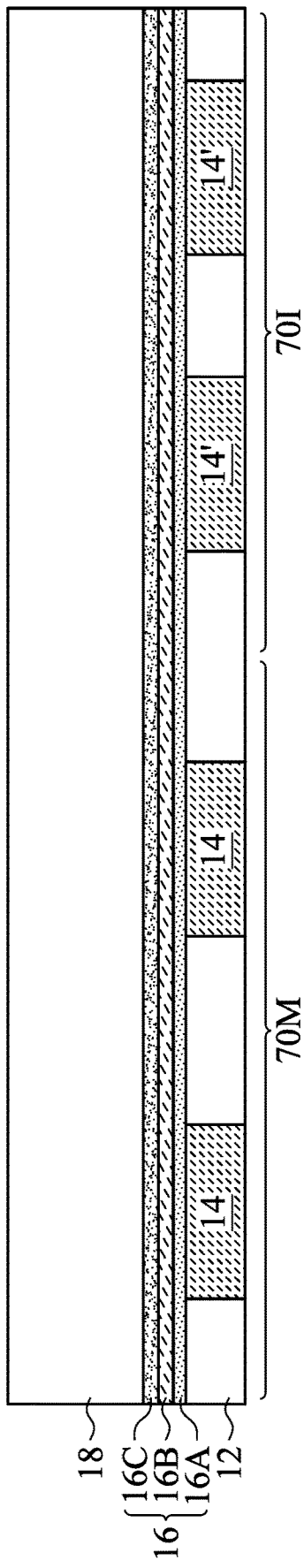
FIGS. 11 through 18 are cross-sectional views of intermediate stages in the formation of MRAM cells in an inter-metal dielectric layer in accordance with some embodiments.
Figure 12:
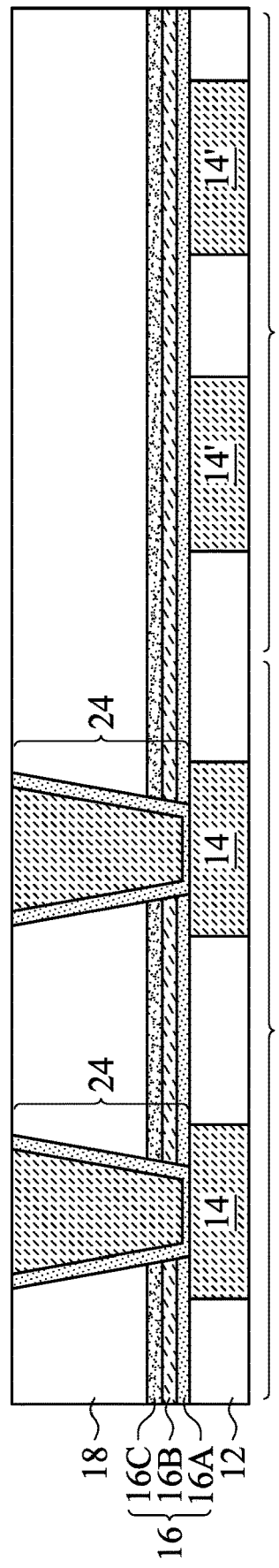

Referring to FIG. 11, dielectric layer 12, conductive features 14 and 14', ESL 16, and dielectric layer 18 are formed. The details of these features have been discussed referring to FIG. 1, and hence are not repeated herein. Next, as shown in FIG. 12, conductive features 24, which may be conductive vias, are formed in dielectric layer 18 and penetrating through ESL 16 to electrically couple to conductive features 14. In accordance with some embodiments, wafer 10 includes MRAM region 70M and interconnect region 70I. Interconnect region 70I is used for forming interconnect structures. Conductive features 24 are formed in MRAM region 70M. Conductive features 14' are in interconnect region 70I.

Figure 13:
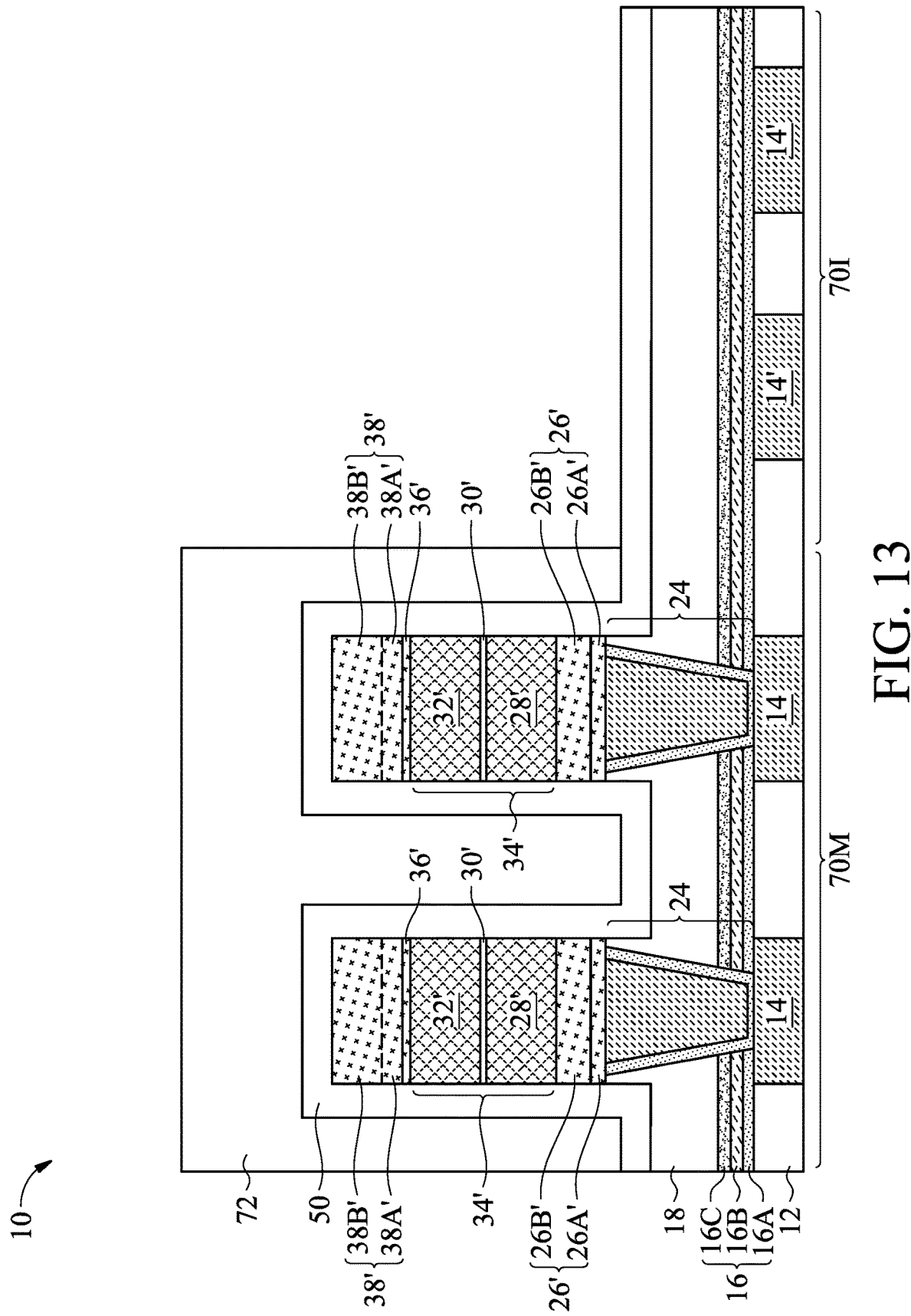
Figure 14:
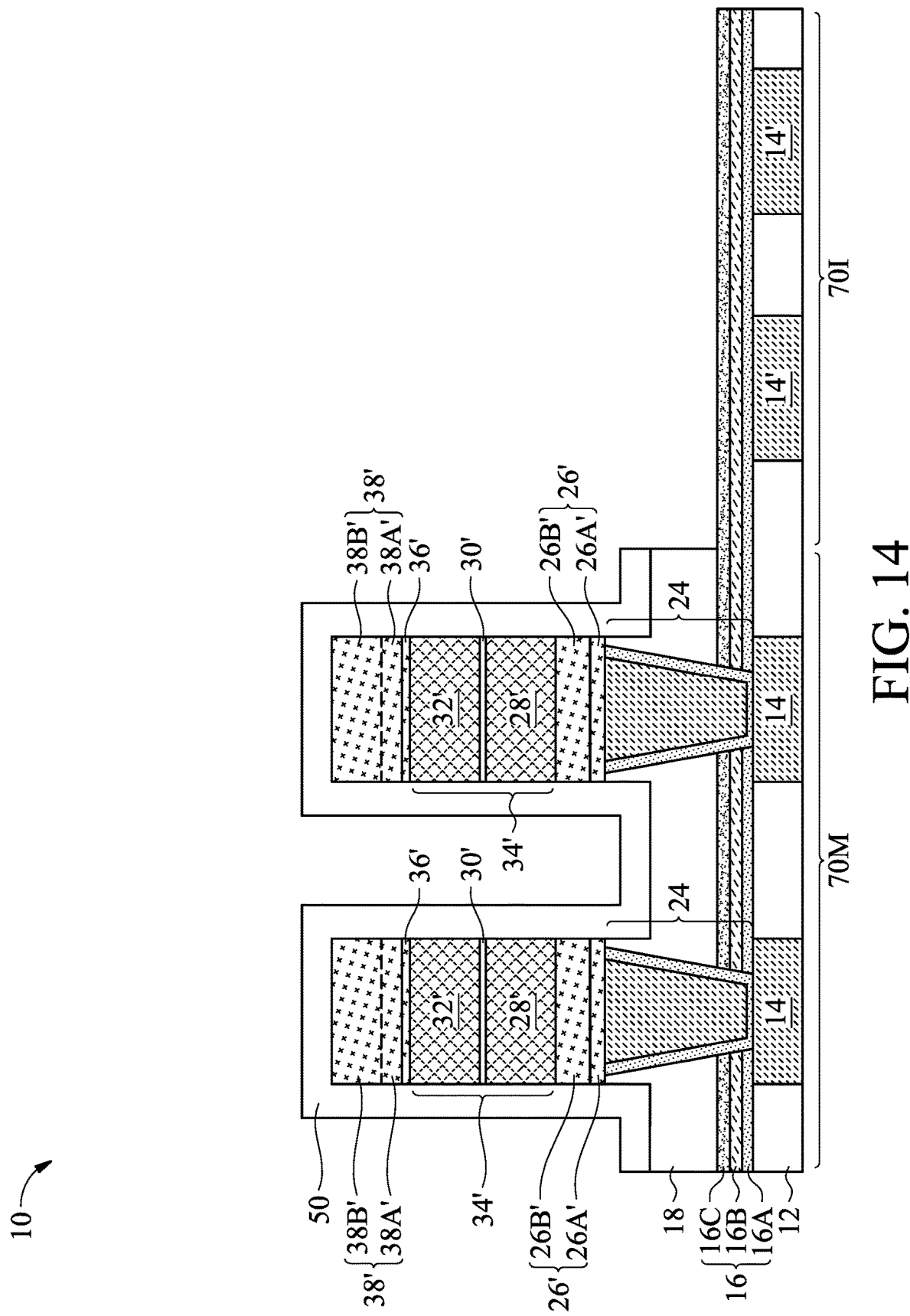

Next, the processes as shown in FIGS. 2 through 8 are performed, hence forming the structure shown in FIG. 13, which is also similar to the structure shown in FIG. 8, except that interconnect region 70I is also shown in FIG. 13. Etching mask 72 is then formed and patterned. In accordance with some embodiments of the present disclosure, etching mask 72 is a photo resist. The portions of etching mask 72 in interconnect region 70I is removed. Dielectric capping layer 50 and the portion of dielectric layer 18 are then removed from interconnect region 70I through etching, in which etching mask 72 is used as the etching mask. Furthermore, etch stop layer 16 may be used for stopping the etching of dielectric layer 18. The resulting structure is shown in FIG. 14. As a result, ESL 16 is exposed.

Figure 15:
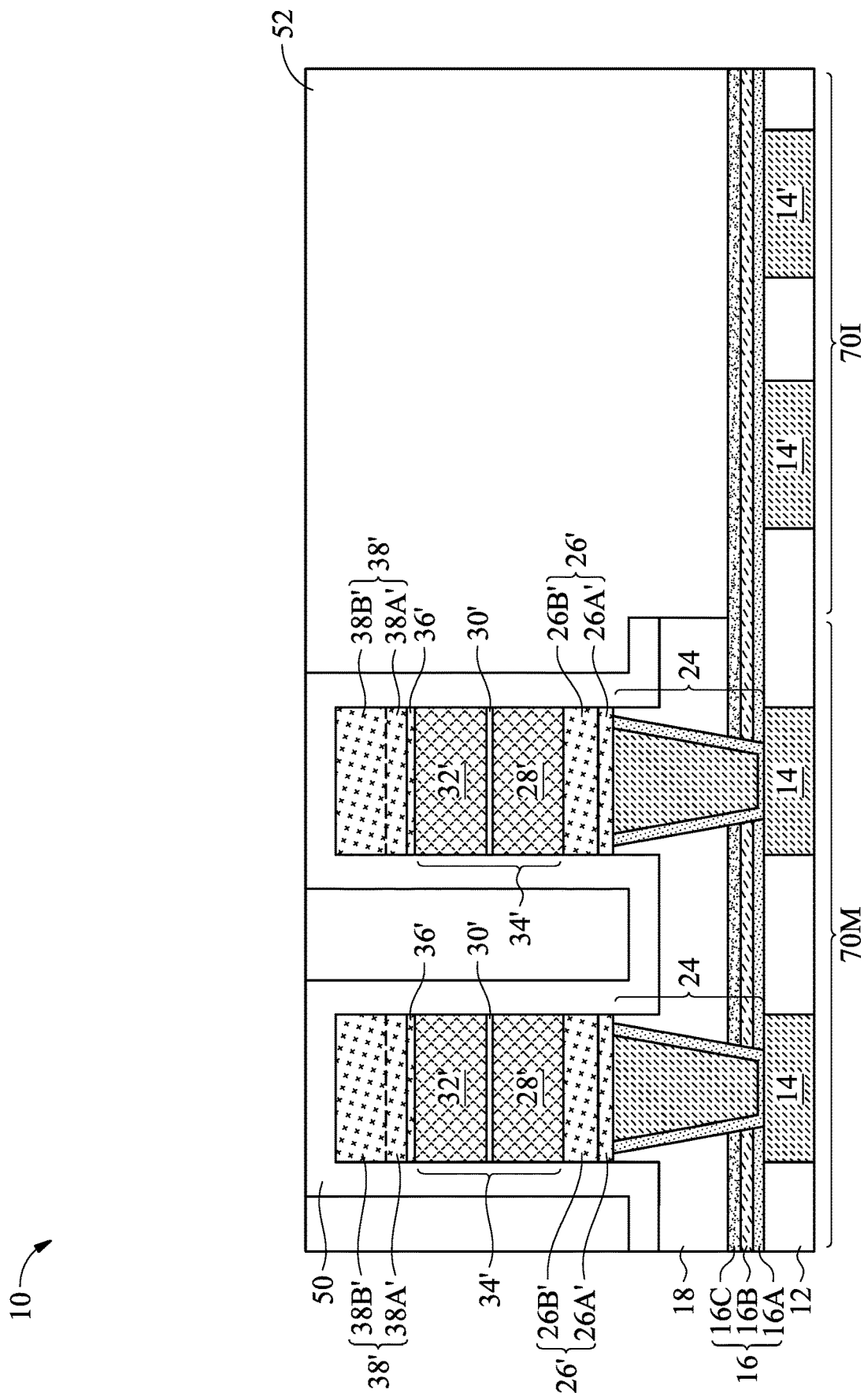
Figure 16:
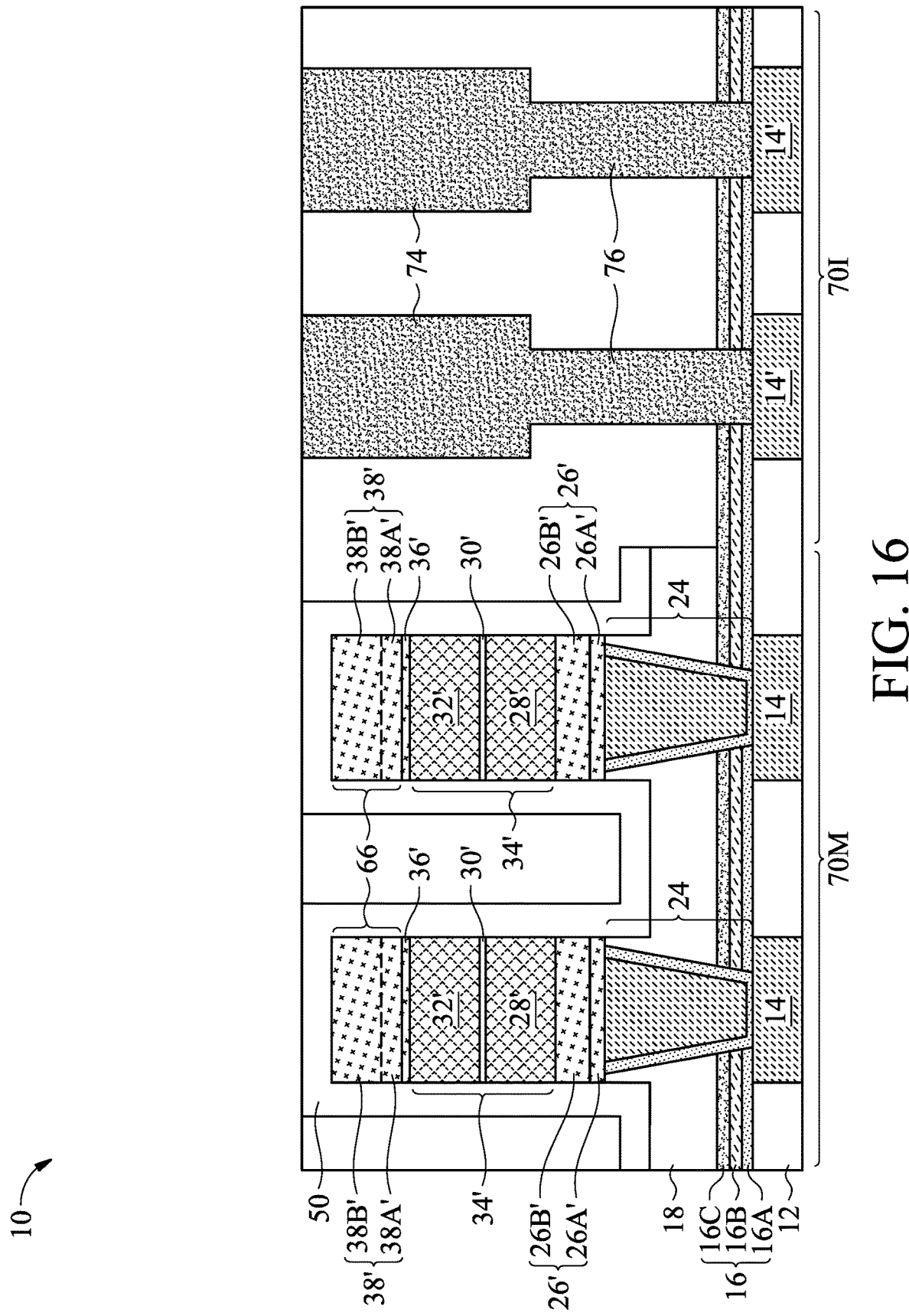

FIG. 15 illustrates the formation of dielectric layer 52. The same step is also shown in FIG. 9. In accordance with some embodiments, dielectric layer 52 is formed of a low-k dielectric layer. Furthermore, dielectric layer 52 may be formed of a same dielectric material as, or a different dielectric material than, dielectric layer 18. Dielectric layer 52 may be in contact with the edges of dielectric layer 18 and dielectric capping layer 50. In a subsequent process, as shown in FIG. 16, metal lines 74 and underlying vias 76 are formed, for example, through a dual damascene process. In accordance with some embodiments, the formation of metal lines 74 and underlying vias 76 includes etching dielectric layer 52 to form via openings and trenches, and then filling the via openings and the trenches with conductive materials. For example, a conductive barrier layer and a filling metal may be filled into the via openings and the trenches. The conductive barrier layer may be formed of titanium, titanium nitride, tantalum, tantalum nitride, or the like. The filling metal may include copper or a copper alloy. After the conductive materials are formed, a planarization process such as a CMP process or a mechanical grind process is performed. Dielectric capping layer 50 or top electrodes 66 may act as a CMP stop layer in the planarization process.

Figure 17:
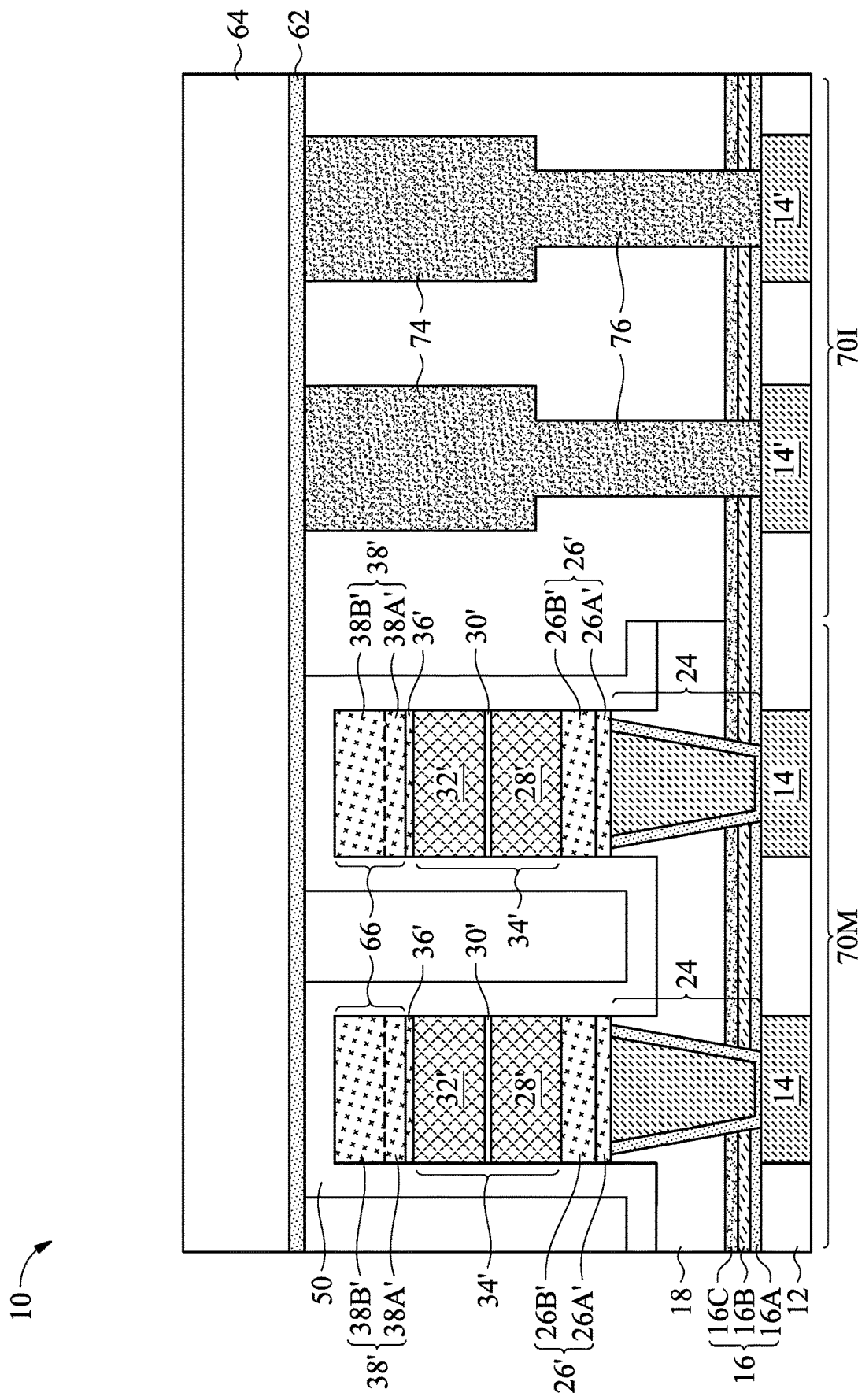
Figure 18:
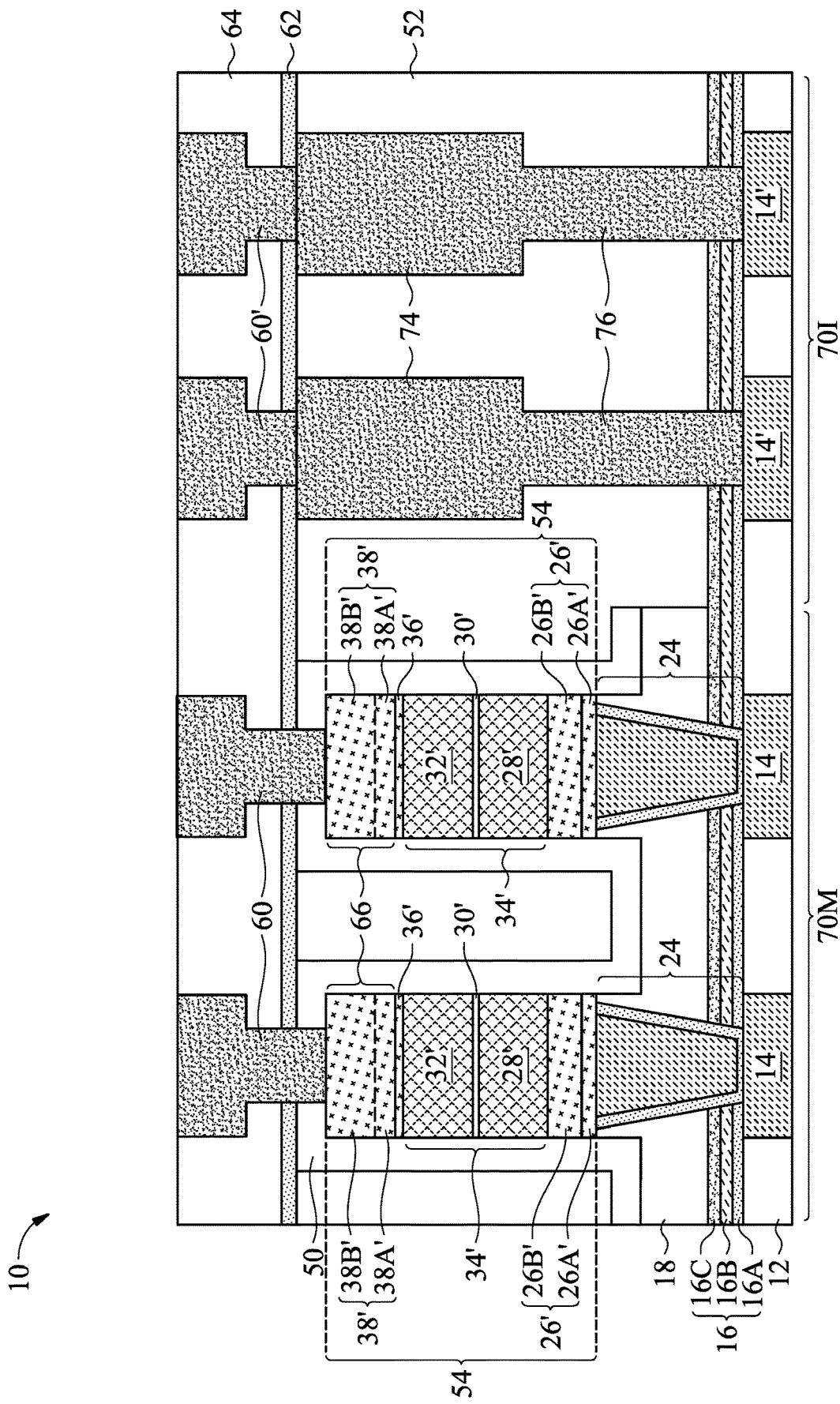

FIG. 17 illustrates the formation of ESL 62 and dielectric layer 64, and the corresponding process is also show in FIG. 10. Next, as shown in FIG. 18, conductive features 60 and 60' are formed, which may be formed in a damascene process.

The embodiments of the present disclosure have some advantageous features. The hard masks and ESLs that are used for patterning the MTJ layers are formed of conductive materials, and are used for forming the top electrodes of the MRAM cells. The manufacturing cost is thus saved. Also, tungsten and ruthenium are good ESL materials for stopping the etching when conductive hard masks are used, and may achieve high etching selectivity. Accordingly, by forming ESLs using tungsten and/or ruthenium, the etching selectivity between the conductive hard masks and the ESL is increased. This results in shallower recesses to be generated in the ESL layer. Since the recesses in the ESL layer will be transferred into the underlying dielectric layer, and the recess depth may be increased (doubled) in the underlying dielectric layer, by adopting the ESL material as disclosed, the recess depth in the dielectric layer is reduced. This solves the potential problem such as the punching-through of the underlying dielectric layer and other problems.

In accordance with some embodiments of the present disclosure, a method of forming integrated circuits includes forming MTJ stack layers; depositing a conductive etch stop layer over the MTJ stack layers; depositing a conductive hard mask over the conductive etch stop layer; patterning the conductive hard mask to form etching masks, wherein the patterning is stopped by the conductive etch stop layer; etching the conducive etch stop layer using the etching masks to define patterns; and etching the MTJ stack layers to form MTJ stacks. In an embodiment, the MTJ stack layers are etched using the conductive hard mask as an etching mask. In an embodiment, the conductive etch stop layer comprises a metal selected from the group consisting essentially of tungsten, ruthenium, and combinations thereof. In an embodiment, the depositing the conductive etch stop layer comprises depositing a tungsten layer. In an embodiment, the conductive hard mask is formed of a material selected from the group consisting of titanium, titanium nitride, tantalum, and tantalum nitride. In an embodiment, the depositing the conductive etch stop layer comprises depositing a ruthenium layer. In an embodiment, the depositing the conductive hard mask comprises depositing a metal-containing material selected from the group consisting of titanium, titanium nitride, tantalum, and tantalum nitride. In an embodiment, the depositing the conductive hard mask comprises depositing a tungsten layer. In an embodiment, the method further comprises forming conductive features over and electrically connecting to the etching masks, wherein the etching masks act as top electrodes.

In accordance with some embodiments of the present disclosure, a method of forming integrated circuits includes forming a bottom electrode layer; forming MTJ stack layers over and electrically connected to the bottom electrode layer; forming a conductive etch stop layer over the MTJ stack layers, wherein the conductive etch stop layer is formed of a material selected from the group consisting of tungsten and ruthenium; forming conductive hard masks over the conductive etch stop layer; etching the conductive etch stop layer using the conductive hard masks as an etching mask; etching the MTJ stack layers to form MTJ stacks, wherein the conductive hard masks are used as the etching mask in the etching the MTJ stack layers; and forming conductive features over and connected to the conductive hard masks. In an embodiment, the method further comprises forming a conductive hard mask layer; etching the conductive hard mask layer to form the conductive hard masks, wherein a patterned etching mask is used to define patterns for the conductive hard masks; and removing the patterned etching mask to expose top surfaces of the conductive hard masks, wherein the etching the MTJ stack layers is performed when the top surfaces of the conductive hard masks are exposed. In an embodiment, the forming the conductive etch stop layer comprises depositing a tungsten layer. In an embodiment, the forming the conductive etch stop layer comprises depositing a ruthenium layer. In an embodiment, the forming the conductive hard masks comprises forming a tungsten layer. In an embodiment, the method further comprises depositing a dielectric capping layer on top surfaces of the conductive hard masks, wherein the dielectric capping layer further contacts sidewalls of the conductive hard masks and the MTJ stacks, wherein the conductive features penetrate through the dielectric capping layer.

In accordance with some embodiments of the present disclosure, an integrated circuit includes a MTJ stack comprising a bottom electrode; a bottom magnetic layer over the bottom electrode; a tunnel barrier over the bottom magnetic layer; and a top magnetic layer over the tunnel barrier; and a top electrode over and electrically coupled to the MTJ stack. The top electrode includes a first conductive layer over the top magnetic layer, wherein the first conductive layer comprises a metal selected from the group consisting of tungsten, ruthenium, and combinations thereof; and a second conductive layer over and contacting the first conductive layer, wherein the second conductive layer is formed of a material different from the first conductive layer. In an embodiment, the first conductive layer comprises ruthenium. In an embodiment, the second conductive layer comprises tungsten. In an embodiment, the first conductive layer comprises tungsten. In an embodiment, the integrated circuit further includes a dielectric capping layer on a top surface of the top electrode, wherein the dielectric capping layer further contacts sidewalls of the top electrode and the MTJ stack; and a conductive feature penetrating through the dielectric capping layer to electrically couple to the top electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming integrated circuits, the method comprising:
   depositing a plurality of layers;
   depositing a conductive etch stop layer over the plurality of layers, wherein the conductive etch stop layer is formed of a homogenous material, and the homogenous material is in physical contact with a top surface of the plurality of layers;
   depositing a conductive hard mask over the conductive etch stop layer;
   patterning the conductive hard mask to form etching masks, wherein the patterning is stopped by the conductive etch stop layer;
   etching the conductive etch stop layer using the etching masks; and
   etching the plurality of layers, with the etching masks defining patterns of remaining portions of the plurality of layers.

2. The method of claim 1, wherein the plurality of layers comprise:
a bottom electrode layer;
a bottom magnetic layer over the bottom electrode layer;
a tunnel layer over the bottom magnetic layer; and
a top magnetic layer over the tunnel layer, wherein the etching the plurality of layers is performed until a dielectric layer underlying the bottom electrode layer is exposed.

3. The method of claim 1, wherein the conductive etch stop layer comprises a metal selected from the group consisting essentially of tungsten, ruthenium, tungsten carbide, and combinations thereof.

4. The method of claim 3, wherein the conductive etch stop layer comprises ruthenium, and the conductive hard mask comprises tungsten.

5. The method of claim 4 further comprising depositing a dielectric capping layer contacting the etching masks and the conductive etch stop layer.

6. The method of claim 1, wherein the depositing the conductive hard mask comprises depositing a tungsten carbide layer.

7. The method of claim 1 further comprising:
depositing a dielectric layer over the etching masks; and
forming conductive plugs penetrating through the dielectric layer to contact the etching masks.

8. The method of claim 1 further comprising:
depositing a dielectric layer to embedded the plurality of layers and the etching masks therein; and
forming a damascene structure comprising a via and a metal line over the via, wherein the damascene structure penetrates through the dielectric layer.

9. A method of forming integrated circuits, the method comprising:
forming a bottom electrode layer;
forming memory layers over and electrically connected to the bottom electrode layer;
forming a metallic etch stop layer over the memory layers;
forming metallic hard masks over the metallic etch stop layer;
etching the metallic etch stop layer using the metallic hard masks as an etching mask;
etching the memory layers to form a plurality of memory cells, wherein the metallic hard masks are used as the etching mask in the etching the memory layers; and
forming conductive features over and connected to the metallic hard masks, wherein the metallic hard masks and remaining parts of the metallic etch stop layer act as top electrodes of the plurality of memory cells.

10. The method of claim 9, wherein the metallic etch stop layer is formed of a material selected from the group consisting of tungsten and ruthenium.

11. The method of claim 9 further comprising:
depositing a metallic hard mask layer;
forming a patterned photoresist over the metallic hard mask layer; and
etching the metallic hard mask layer to form the metallic hard masks, wherein the patterned photoresist is used as an etching mask.

12. The method of claim 9, wherein the forming the metallic etch stop layer comprises depositing a first tungsten layer or a tungsten carbide layer.

13. The method of claim 12, wherein the forming the metallic etch stop layer comprises depositing the first tungsten layer, and wherein the forming the metallic etch stop layer further comprises depositing a ruthenium layer over the first tungsten layer.

14. The method of claim 13, wherein the forming the metallic hard masks comprises depositing a second tungsten layer and patterning the second tungsten layer.

15. The method of claim 9 further comprising:
depositing a dielectric capping layer contacting sidewalls of the metallic hard masks and the memory layers, wherein the conductive features penetrate through the dielectric capping layer.

16. The method of claim 15 further comprising:
depositing a low-k dielectric layer comprising a first portion overlapping the dielectric capping layer, and a second portion forming a vertical interface with the dielectric capping layer; and
forming a metal line and a via in the low-k dielectric layer.

17. A method of forming integrated circuits, the method comprising:
depositing a first metal layer;
depositing a second metal layer over the first metal layer;
patterning the second metal layer to form etching masks, wherein the patterning the second metal layer is performed using the first metal layer as an etch stop layer, and the patterning is stopped on a top surface of the first metal layer; and
patterning the first metal layer and a third metal layer underlying the first metal layer using the etching masks to define patterns.

18. The method of claim 17 further comprising:
depositing the third metal layer; and
depositing Magnetic Tunnel Junction (MTJ) stack layers over the third metal layer; and
patterning the MTJ stack layer using the etching masks.

19. The method of claim 17, wherein the depositing the first metal layer comprises depositing ruthenium.

20. The method of claim 19, wherein the depositing the second metal layer comprises depositing tungsten.

* * * * *